(12) United States Patent
Nakazawa

(10) Patent No.: US 11,929,123 B2
(45) Date of Patent: *Mar. 12, 2024

(54) SEMICONDUCTOR MEMORY DEVICE WITH ERASE LOOPS

(71) Applicant: KIOXIA CORPORATION, Tokyo (JP)

(72) Inventor: Shingo Nakazawa, Kamakura (JP)

(73) Assignee: KIOXIA CORPORATION, Tokyo (JP)

( * ) Notice: Subject to any disclaimer, the term of this patent is extended or adjusted under 35 U.S.C. 154(b) by 179 days.

This patent is subject to a terminal disclaimer.

(21) Appl. No.: 17/643,726

(22) Filed: Dec. 10, 2021

(65) Prior Publication Data

US 2022/0406384 A1 Dec. 22, 2022

(30) Foreign Application Priority Data

Jun. 21, 2021 (JP) ................. 2021-102805

(51) Int. Cl.
| G11C 16/16 | (2006.01) |
| G11C 16/34 | (2006.01) |
| H10B 41/27 | (2023.01) |
| H10B 43/27 | (2023.01) |

(52) U.S. Cl.
CPC .......... *G11C 16/16* (2013.01); *G11C 16/3445* (2013.01); *H10B 41/27* (2023.02); *H10B 43/27* (2023.02)

(58) Field of Classification Search
CPC . G11C 16/16; G11C 16/3445; G11C 16/0483; G11C 8/08; G11C 7/12; H10B 41/27; H10B 43/27; H10B 43/35
See application file for complete search history.

(56) References Cited

U.S. PATENT DOCUMENTS

| 9,397,110 | B2 | 7/2016 | Lue |
| 9,666,594 | B2 | 5/2017 | Mizuno et al. |
| 10,147,731 | B2 | 12/2018 | Cha |
| 2016/0260725 | A1* | 9/2016 | Jung ............ H10B 43/10 |
| 2019/0088588 | A1 | 3/2019 | Arai et al. |
| 2021/0013227 | A1 | 1/2021 | Futatsuyama et al. |
| 2022/0084608 | A1 | 3/2022 | Nakazawa et al. |

FOREIGN PATENT DOCUMENTS

| JP | 2019-54182 A | 4/2019 |
| JP | 2022-48489 A | 3/2022 |

* cited by examiner

*Primary Examiner* — Sultana Begum
(74) *Attorney, Agent, or Firm* — Oblon, McClelland, Maier & Neustadt, L.L.P.

(57) ABSTRACT

A semiconductor memory device includes first conductive layers, second conductive layers, a first semiconductor layer, a charge storage layer, and a first wiring. The semiconductor memory device is configured to execute an erase operation including a first and a second erase loop. In the first erase loop, the semiconductor memory device applies a first voltage to at least a part of the first conductive layers and at least a part of the second conductive layers and applies an erase voltage larger than the first voltage to the first wiring. In the second erase loop, the semiconductor memory device applies the first voltage to at least a part of the first conductive layers, applies a second voltage larger than the first voltage to at least apart of the second conductive layers, and applies the erase voltage to the first wiring.

20 Claims, 25 Drawing Sheets

SEMICONDUCTOR MEMORY DEVICE WITH ERASE LOOPS

CROSS-REFERENCE TO RELATED APPLICATIONS

This application is based upon and claims the benefit of Japanese Patent Application No. 2021-102805, filed on Jun. 21, 2021, the entire contents of which are incorporated herein by reference.

BACKGROUND

Field

Embodiments described herein relate generally to a semiconductor memory device.

Description of the Related Art

There has been known a semiconductor memory device that includes a semiconductor substrate, a plurality of conductive layers arranged in a direction intersecting with a surface of the semiconductor substrate, a semiconductor layer opposed to these plurality of conductive layers, and a gate insulating layer disposed between the conductive layers and the semiconductor layer. The gate insulating layer includes a memory unit that can store data, for example, an insulating charge storage layer of silicon nitride ($Si_3N_4$) or the like, and a conductive charge storage layer, such as a floating gate.

DETAILED DESCRIPTION

Figure 1:
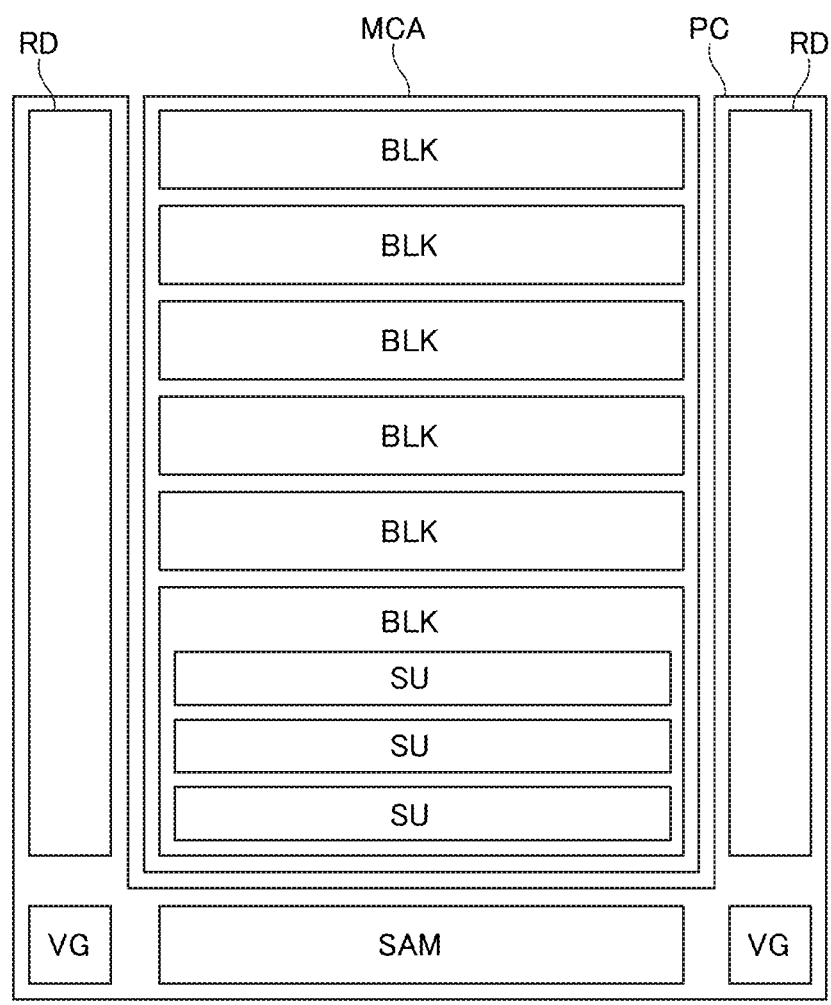
FIG. 1 is a schematic block diagram illustrating a part of a configuration of a semiconductor memory device according to a first embodiment.

A semiconductor memory device according to one embodiment comprising: a plurality of first conductive layers arranged in a first direction; a plurality of second conductive layers disposed to be spaced from the plurality of first conductive layers in a second direction intersecting with the first direction, the plurality of second conductive layers being arranged in the first direction; a first semiconductor layer disposed between the plurality of first conductive layers and the plurality of second conductive layers, the first semiconductor layer extending in the first direction and being opposed to the plurality of first conductive layers and the plurality of second conductive layers; a charge storage layer including a first part and a second part, the first part being disposed between the plurality of first conductive layers and the first semiconductor layer, the second part being disposed between the plurality of second conductive layers and the first semiconductor layer; and a first wiring electrically connected to the first semiconductor layer. The semiconductor memory device is configured to be able to execute an erase operation including a first erase loop and a second erase loop. In the first erase loop, the semiconductor memory device applies a first voltage to at least a part of the plurality of first conductive layers, applies the first voltage to at least a part of the plurality of second conductive layers, and applies an erase voltage larger than the first voltage to the first wiring. In the second erase loop, the semiconductor memory device applies the first voltage to at least a part of the plurality of first conductive layers, applies a second voltage larger than the first voltage to at least a part of the plurality of second conductive layers, and applies the erase voltage to the first wiring.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Configuration]

Figure 2:
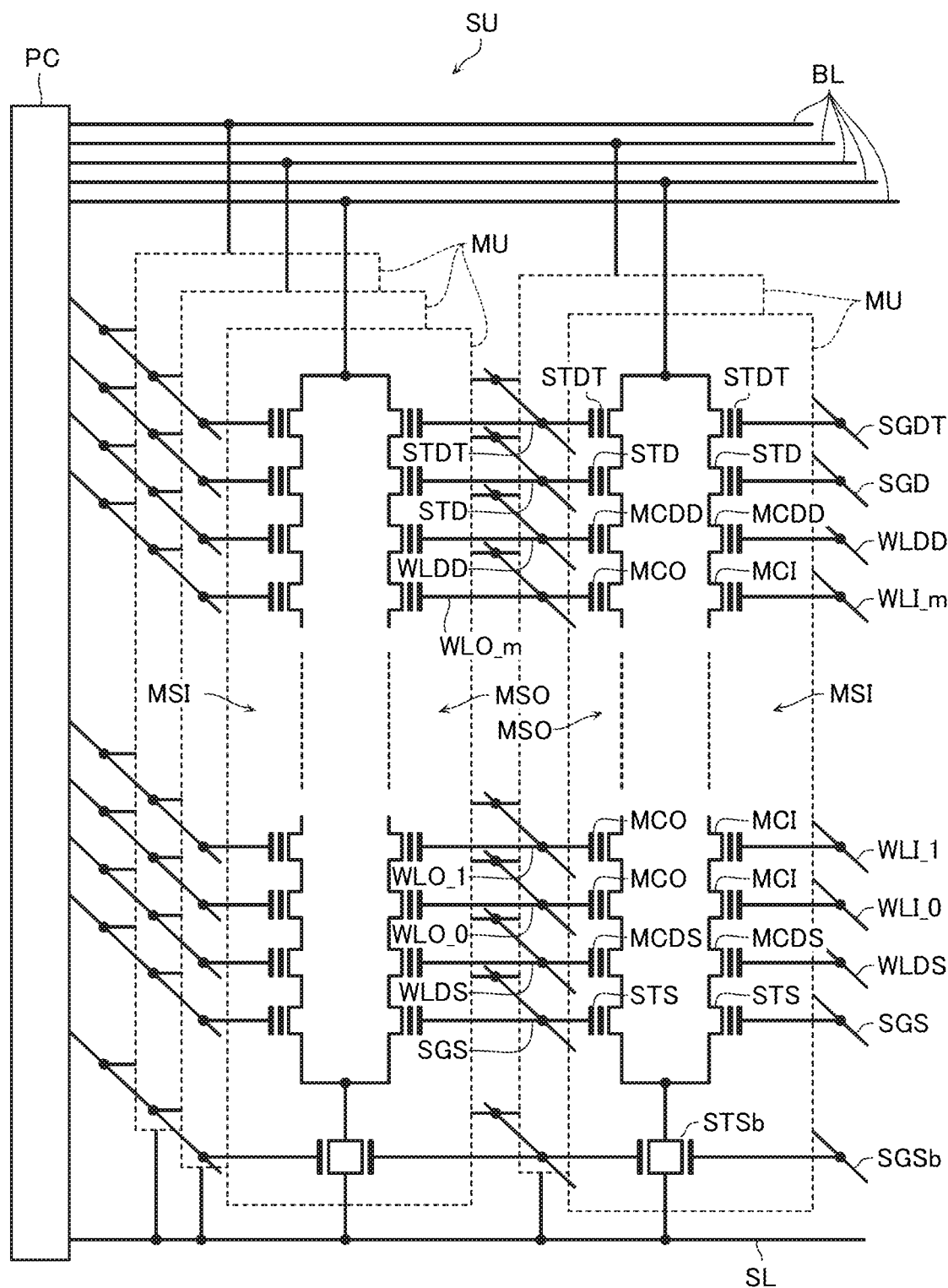
FIG. 2 is a schematic equivalent circuit diagram illustrating a part of the configuration of the semiconductor memory device.
Figure 3:
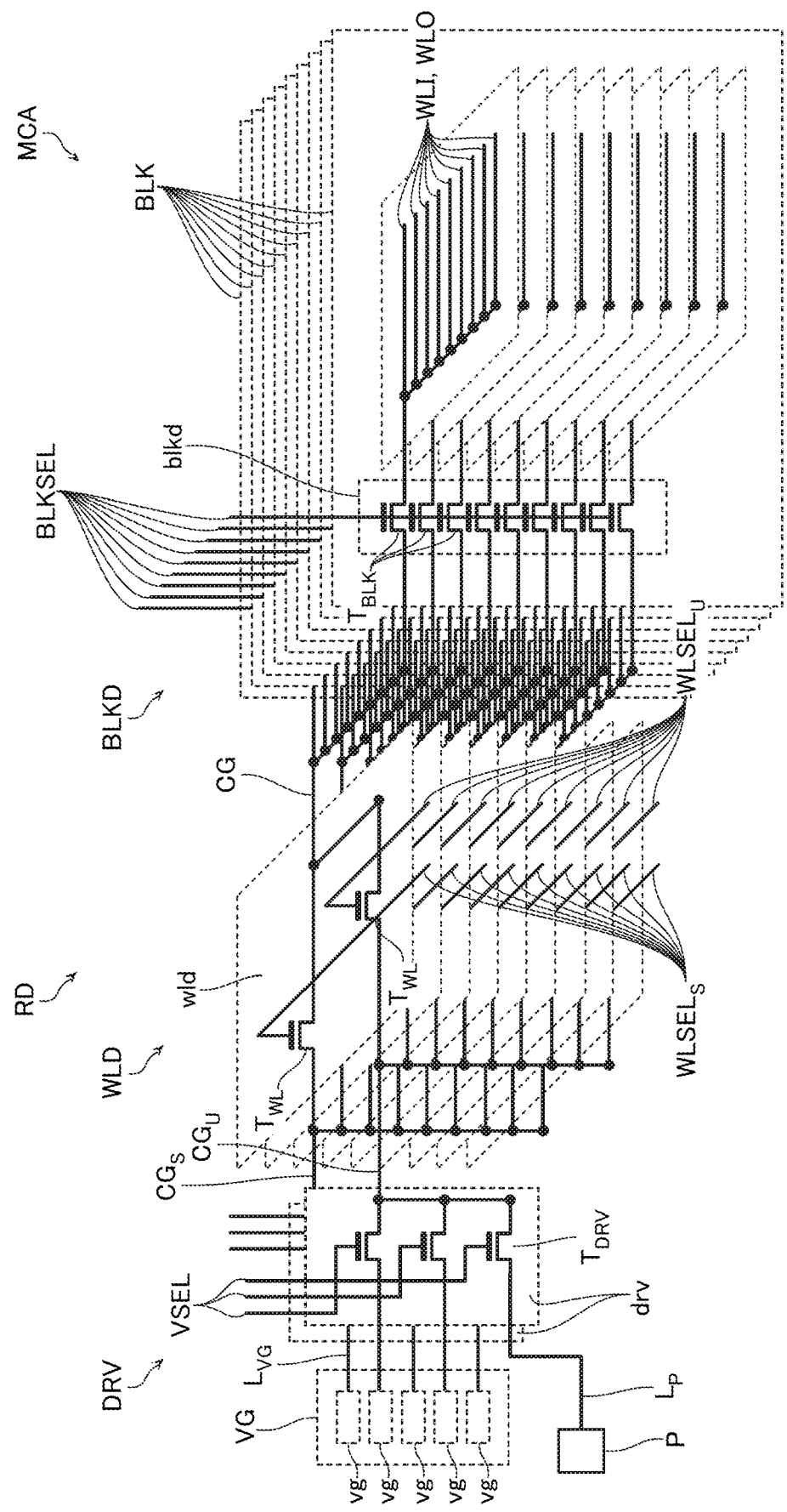
FIG. 3 is a schematic equivalent circuit diagram illustrating a part of the configuration of the semiconductor memory device.

FIG. 1 is a schematic block diagram illustrating a part of a configuration of a semiconductor memory device according to the first embodiment. FIGS. 2 and 3 are schematic equivalent circuit diagrams illustrating a part of the configuration of the semiconductor memory device.

As illustrated in FIG. 1, the semiconductor memory device according to the embodiment includes a memory cell array MCA and a peripheral circuit PC controlling the memory cell array MCA.

The memory cell array MCA includes a plurality of memory blocks BLK. The memory block BLK includes a plurality of string units SU. The string units SU includes, for example, as illustrated in FIG. 2, a plurality of memory units MU. These plurality of memory units MU each include two memory strings MSI, MSO. One ends of these memory strings MSI, MSO are each connected to drain-side select transistors STD, STDT and connected to a common bit line BL via the drain-side select transistors STD, STDT. The other ends of the memory strings MSI, MSO are connected to common source-side select transistors STS, STSb and connected to a common source line SL via the source-side select transistors STS, STSb.

The memory string MSI includes m+1 (m is an integer equal to or more than 1) memory cells MCI connected in series. The memory string MSO includes m+1 memory cells MCO connected in series. The memory cells MCI, MCO are each a field-effect type transistor that includes a semiconductor layer, a gate insulating layer, and a gate electrode. The semiconductor layer functions as a channel region. The gate insulating layer includes a charge storage layer that can store data. Threshold voltages of the memory cells MCI and MCO change according to an electric charge amount in the charge storage layer. The gate electrodes of the m+1 memory cells MCI are each connected to word lines WLI_0 to WLI_m. The gate electrodes of the mil memory cells MCO are each connected to word lines WLO_0 to WLO_m. The word lines WLI_0 to WLI_m, WLO_0 to WLO_m are each connected to all the memory units MU in the memory block BLK.

The memory strings MSI, MSO include one or a plurality of dummy memory cells MCDD connected between the plurality of memory cells MCI, MCO and the drain-side select transistors STD. The memory strings MSI, MSO include one or a plurality of dummy memory cells MCDS connected between the plurality of memory cells MCI, MCO and the source-side select transistor STS. The dummy memory cells MCDD, MCDS are constituted similarly to the memory cells MCI, MCO. However, the dummy memory cells MCDD, MCDS are not used for storing the data. A gate electrode of the dummy memory cell MCDD is connected to a dummy word line WLDD. A gate electrode of the dummy memory cell MCDS is connected to a dummy word line WLDS. The dummy word lines WLDD, WLDS are each connected to all the memory units MU in the memory block BLK.

The select transistors (STD, STDT, STS, STSb) are field-effect type transistors that each includes a semiconductor layer, a gate insulating layer, and a gate electrode. The semiconductor layer functions as a channel region. The gate electrode of the drain-side select transistor STDT is connected to a drain-side select gate line SGDT. The drain-side select gate line SGDT is connected to all the memory units MU in the memory block BLK. The gate electrode of the drain-side select transistor STD is connected to a drain-side select gate line SGD. The drain-side select gate line SGD is connected to all memory units MU in the string unit SU. The gate electrodes of the source-side select transistors STS, STSb are connected to source-side select gate lines SGS, SGSb, respectively. The source-side select gate lines SGS, SGSb are each connected to all the memory units MU in the memory block BLK.

The peripheral circuit PC includes, for example, as illustrated in FIG. 1, row decoders RD connected to the memory cell array MCA, a sense amplifier module SAM connected to the memory cell array MCA, and voltage generation circuits VG connected to the row decoders RD and the sense amplifier module SAM. The peripheral circuit PC includes a sequencer, an address register, a status register, and the like, which are not illustrated.

The row decoder RD includes, for example, as illustrated in FIG. 3, a block decoder BLKD, a word line decoder WLD, and a driver circuit DRV.

The block decoder BLKD includes a plurality of block decode units blkd disposed corresponding to the plurality of memory blocks BLK in the memory cell array MCA. The block decode unit blkd includes a plurality of transistors $T_{BLK}$ disposed corresponding to the plurality of word lines WLI, WLO in the memory blocks BLK. The transistor $T_{BLK}$ is, for example, a field-effect type NMOS transistor. Drain electrodes of the transistors $T_{BLK}$ are connected to the word lines WLI, WLO. A source electrode of the transistor $T_{BLK}$ is connected to a wiring CG. The wiring CG is connected to all the block decode units blkd in the block decoder BLKD. A gate electrode of the transistor $T_{BLK}$ is connected to a signal supply line BLKSEL. A plurality of signal supply lines BLKSEL are disposed corresponding to all the block decode units blkd. The signal supply line BLKSEL is connected to all the transistors $T_{BLK}$ in the block decode unit blkd.

In a read operation, a write operation, an erase operation, and the like, for example, one signal supply line BLKSEL corresponding to a block address in the address register (not illustrated) becomes an "H" state, and the other signal supply lines BLKSEL become an "L" state. For example, a predetermined driving voltage having a positive magnitude is applied to the one signal supply line BLKSEL and a ground voltage $V_{SS}$ or the like is applied to the other signal supply lines BLKSEL. Accordingly, all the word lines WLI, WLO in one memory block BLK corresponding to this block address are electrically conducted to all the wirings CG. All the word lines WLI, WLO in the other memory blocks BLK become a floating state.

The word line decoder WLD includes a plurality of word line decode units wld disposed corresponding to the plurality of memory cells MCI, MCO in the memory strings MSI, MSO. In the illustrated example, the word line decode unit wld includes two transistors $T_{WL}$. The transistor $T_{WL}$ is, for example, a field-effect type NMOS transistor. A drain electrode of the transistor $T_{WL}$ is connected to the wiring CG. A source electrode of the transistor $T_{WL}$ is connected to a wiring $CG_S$ or a wiring $CG_U$. A gate electrode of the transistor $T_{WL}$ is connected to a signal supply line $WLSEL_S$ or a signal supply line $WLSEL_U$. A plurality of the signal supply lines $WLSEL_S$ are disposed corresponding to one transistors $T_{WL}$ included in all the word line decode units wld. A plurality of the signal supply lines $WLSEL_U$ are disposed corresponding to the other transistors $T_{WL}$ included in all the word line decode units wld.

In the read operation, the write operation, and the like, for example, the signal supply line $WLSEL_S$ corresponding to one word line decode unit wld corresponding to a page address in the address register (not illustrated) becomes the "H" state, and the signal supply line $WLSEL_U$ corresponding to this becomes the "L" state. The signal supply lines $WLSEL_S$ corresponding to the other word line decode units wld become the "L" state, and the signal supply lines $WLSEL_U$ corresponding to them become the "H" state. The wiring $CG_S$ is applied with a voltage corresponding to selected word lines WLI, WLO. The wiring $CG_U$ is applied with a voltage corresponding to unselected word lines WLI, WLO. Accordingly, one word lines WLI, WLO corresponding to the above-described page address are applied with the voltage corresponding to the selected word lines WLI, WLO. The other word lines WLI, WLO are applied with the voltage corresponding to the unselected word lines WLI, WLO. When the page address in the address register (not illustrated) corresponds to the word line WLI, all the word lines WLO are applied with the voltage corresponding to the unselected word lines WLI, WLO. Similarly, When the page address in the address register (not illustrated) corresponds to the word line WLO, all the word lines WLI are applied with the voltage corresponding to the unselected word lines WLI, WLO.

The driver circuit DRV includes, for example, two driver units drv disposed corresponding to the wiring $CG_S$ and the wiring $CG_U$. The driver unit dry includes a plurality of transistors $T_{DRV}$. The transistor $T_{DRV}$ is, for example, a field-effect type NMOS transistor. A drain electrode of the transistor $T_{DRV}$ is connected to the wiring $CG_S$ or the wiring $CG_U$. A source electrode of the transistor $T_{DRV}$ is connected to a voltage supply line $L_{VG}$ or a voltage supply line $L_P$. The voltage supply line $L_{VG}$ is connected to one of a plurality of output terminals of the voltage generation circuit VG. The voltage supply line $L_P$ is connected to a bonding pad electrode P to which the ground voltage $V_{SS}$ is applied. A gate electrode of the transistor is connected to a signal supply line VSEL.

In the read operation, the write operation, the erase operation, and the like, for example, any of a plurality of signal supply lines VSEL corresponding to one driver unit dry becomes the "H" state, and the other signal supply lines VSEL become the "L" state.

For example, as illustrated in FIG. 3, the voltage generation circuit VG includes a plurality of voltage generation units vg. In the read operation, the write operation, and the like, the voltage generation unit vg generates a voltage of a predetermined magnitude, and outputs it via the voltage supply line $L_{VG}$. For example, the voltage generation unit vg may be a step up circuit, such as a charge pump circuit, or may be a step down circuit, such as a regulator.

The sense amplifier module SAM (FIG. 1) includes a plurality of sense amplifier units (not illustrated) disposed corresponding to a plurality of the bit lines BL (FIG. 2). The sense amplifier unit includes a sense transistor including a gate electrode electrically connected to the bit line BL, a plurality of data latch circuits connected to a drain electrode of the sense transistor, and a voltage adjustment circuit adjusting a voltage of the bit line BL in accordance with data of one of these plurality of data latch circuits.

Figure 4:
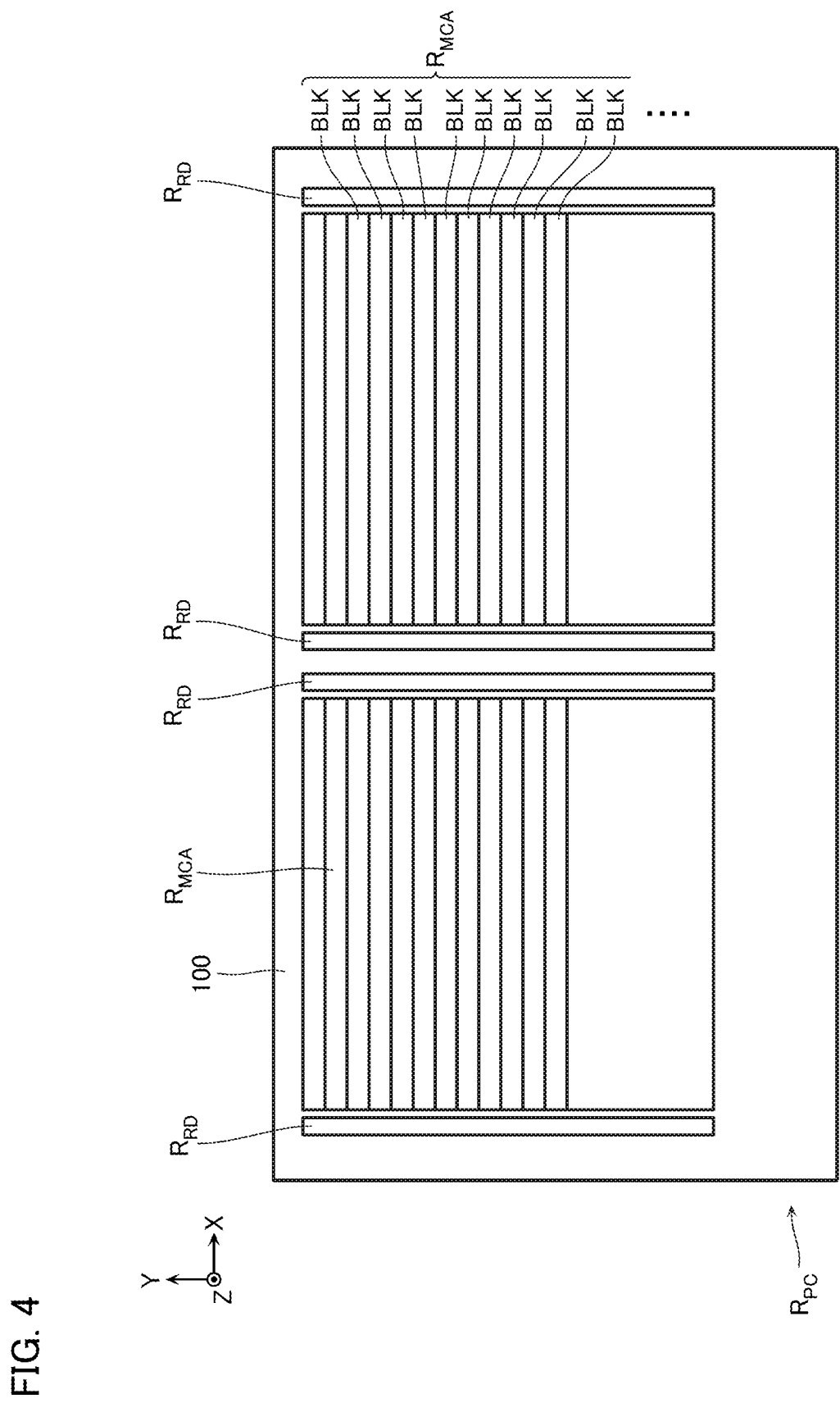
FIG. 4 is a schematic plan view illustrating a part of the configuration of the semiconductor memory device.
Figure 5:
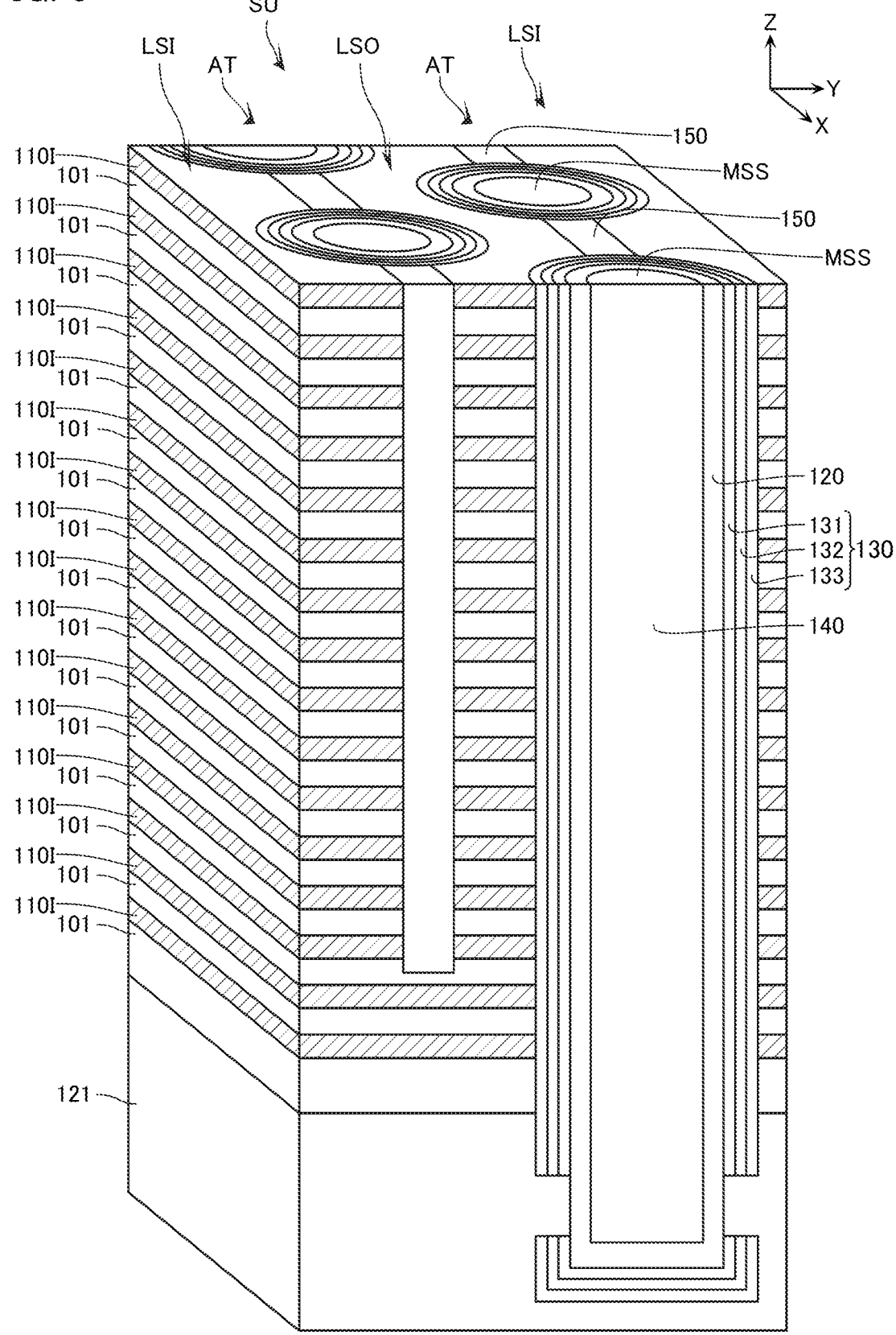
FIG. 5 is a schematic perspective view illustrating apart of the configuration of the semiconductor memory device.
Figure 6:
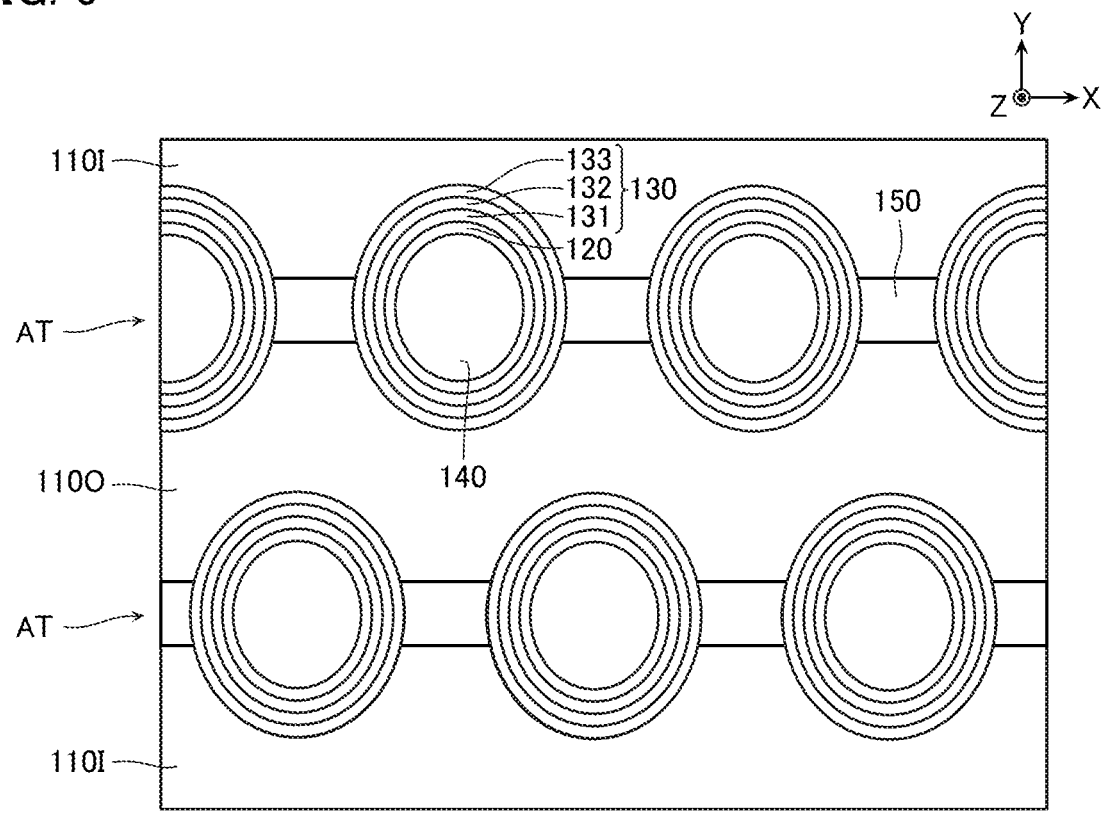
FIG. 6 is a schematic plan view illustrating a part of the configuration of the semiconductor memory device.

Next, with reference to FIGS. 4 to 6, an exemplary configuration of the semiconductor memory device according to the embodiment will be described. FIG. 4 is a schematic plan view illustrating a part of the configuration of the semiconductor memory device according to the embodiment. FIG. 5 is a schematic perspective view illustrating a part of the configuration of the semiconductor memory device according to the embodiment. FIG. 6 is a schematic plan view illustrating a part of the configuration of the semiconductor memory device according to the embodiment.

As illustrated in FIG. 4, the semiconductor memory device according to the embodiment includes a semiconductor substrate 100. In the illustrated example, the semiconductor substrate 100 includes two memory cell array regions $R_{MCA}$ arranged in the X-direction. Row decoder regions $R_{RD}$ are disposed at positions side by side with the memory cell array region $R_{MCA}$ in the X-direction. A peripheral circuit region $R_{PC}$ is disposed at an end portion of the semiconductor substrate 100 in the Y-direction.

The semiconductor substrate 100 is, for example, a semiconductor substrate of a single-crystal silicon (Si) containing p-type impurities. An n-type well containing n-type impurities and a p-type well containing p-type impurities are disposed on an upper surface of the semiconductor substrate. On the surface of the semiconductor substrate 100, for example, a transistor, a wiring, and the like constituting at least a part of the peripheral circuit PC (FIG. 1) are disposed.

A plurality of memory blocks BLK arranged in the Y-direction are disposed in the memory cell array region $R_{MCA}$. As described with reference to FIG. 1 and the like, the memory block BLK includes the plurality of string units SU. For example, as illustrated in FIG. 5, the string unit SU includes a plurality of stacked structures LSI, LSO alternately arranged in the Y-direction and trench structures AT respectively disposed between these plurality of stacked structures LSI, LSO. The stacked structure LSI includes, for example, m+7 conductive layers 110I stacked in the Z-direction. The stacked structure LSO includes, for example, m+7 conductive layers 110O stacked in the Z-direction (see FIGS. 5 and 6). The trench structure AT includes a plurality of memory string structures MSS arranged in the X-direction. Each memory string structure MSS includes a semiconductor layer 120 extending in the Z-direction and having an approximately closed-bottomed cylindrical shape, a gate insulating layer 130 disposed between the stacked structures LSI, LSO and the semiconductor layer 120, and an insulating layer 140 of silicon oxide ($SiO_2$) or the like disposed at the center part of the semiconductor layer 120. Insulating layers 150 of silicon oxide ($SiO_2$) or the like are respectively disposed between two of the plurality of memory string structures MSS arranged in the X-direction.

The conductive layers 110I, 110O are approximately plate-shaped conductive layers extending in the X-direction, and are, for example, a stacked film of titanium nitride (TiN) and tungsten (W), or conductive layers of polycrystalline silicon (Si) injected with impurities, or the like. Insulating layers 101 of silicon oxide ($SiO_2$) or the like are respectively disposed between the plurality of conductive layers 110I, 110O arranged in the Z-direction.

Among the plurality of conductive layers 110I, 110O, the conductive layers 110I, 110O located at the first position counted from the lower side function as the gate electrode of the source-side select transistor STSb and the source-side select gate line SGSb.

Among the plurality of conductive layers 110I, 110O, the conductive layers 110I, 110O located at the second position counted from the lower side function as the gate electrode of the source-side select transistor STS and the source-side select gate line SGS.

Among the plurality of conductive layers 110I, 110O, the conductive layers 110I, 110O located at the third position counted from the lower side function as the gate electrode of the dummy memory cell MCDS and the dummy word line WLDS.

Among the plurality of conductive layers 110I, the conductive layers 110I located at the fourth position to the (m+4)-th position counted from the lower side function as the gate electrode of the memory cell MCI and the word lines WLI_0 to WLI_m.

Among the plurality of conductive layers 110O, the conductive layers 110O located at the fourth position to (m+4)-th position counted from the lower side function as the gate electrode of the memory cell MCO and the word lines WLO_0 to WLO_m.

Among the plurality of conductive layers 110I, 110O, the conductive layers 110I, 110O located at the (m+5)-th position counted from the lower side function as the gate electrode of the dummy memory cell MCDD and the dummy word line WLDD.

Among the plurality of conductive layers 110I, 110O, the conductive layers 110I, 110O located at the (m+6)-th position counted from the lower side function as the gate electrode of the drain-side select transistor STD and the drain-side select gate line SGD.

Among the plurality of conductive layers 110I, 110O, the conductive layers 110I, 110O located at the (m+7)-th position counted from the lower side function as the gate electrode of the drain-side select transistor STDT and the drain-side select gate line SGDT.

The semiconductor layer 120 (FIG. 5) includes, for example, non-doped polycrystalline silicon (Si) or the like. As described above, the semiconductor layer 120 has an approximately closed-bottomed cylindrical shape. The semiconductor layer 120 functions as the channel regions of the plurality of memory cells MCI, MCO, the dummy memory cells MCDD, MCDS and the select transistors (STSb, STS, STD, STDT) corresponding to the memory strings MSI, MSO (FIG. 2).

A semiconductor layer 121 (FIG. 5) is connected to a lower end of the semiconductor layer 120. The semiconductor layer 121 includes, for example, polycrystalline silicon (Si) containing n-type impurities such as phosphorus (P), or the like. The semiconductor layer 121 functions as the source line SL (FIG. 2).

While the illustration is omitted, an impurity layer of polycrystalline silicon (Si) containing n-type impurities such as phosphorus (P), or the like is formed on an upper end of the semiconductor layer 120. The semiconductor layer 120 is electrically connected to the bit line BL (FIG. 2) via this impurity layer.

The gate insulating layer 130 has an approximately cylindrical shape, and extends in the Z-direction along an outer peripheral surface of the semiconductor layer 120. The gate insulating layer 130 includes a tunnel insulating layer 131 of silicon oxide ($SiO_2$) or the like, a charge storage layer 132 of silicon nitride (SiN) or the like, and a block insulating layer 133 of silicon oxide ($SiO_2$) or the like, which are disposed from the semiconductor layer 120 side to the sides of the conductive layers 110I, 110O.

[Threshold Voltages of Memory Cells MCI, MCO]

Figure 7:
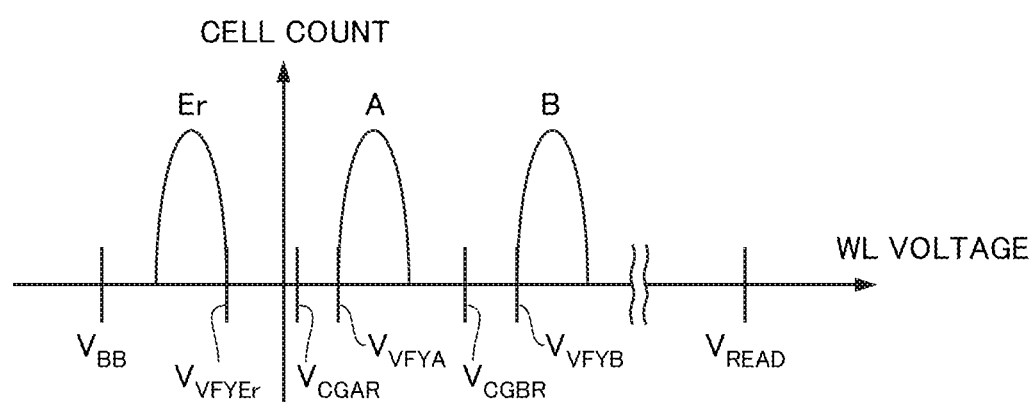
FIG. 7 is a schematic histogram for describing threshold voltages of memory cells MCI, MCO where data of a plurality of bits is stored.

Next, with reference to FIG. 7, the threshold voltages of the memory cells MCI, MCO are described.

As described above, the memory cell array MCA includes the plurality of memory cells MCI, MCO. When the write operation is executed to these plurality of memory cells MCI, MCO, the threshold voltages of these memory cells MCI, MCO are controlled in a plurality of states.

FIG. 7 is a schematic histogram for describing the threshold voltages of the memory cells MCI, MCO in which data of a plurality of bits is stored. The horizontal axis indicates the voltages of the word lines WLI, WLO and the vertical axis indicates the numbers of the memory cells MCI, MCO.

FIG. 7 illustrates three distributions of the threshold voltages of the memory cells MCI, MCO. For example, the threshold voltages of the memory cells MCI, MCO controlled in a state Er are larger than a read blocking voltage $V_{BB}$ and smaller than a read voltage $V_{CGAR}$. The largest threshold voltage included in the threshold distribution of the state Er has a magnitude approximately equal to a magnitude of an erase verify voltage $V_{VFYEr}$. The threshold voltages of the memory cells MCI, MCO controlled in a state A are larger than the read voltage $V_{CGAR}$ and smaller than a read voltage $V_{CGBR}$. The smallest threshold voltage included in the threshold distribution of the state A has a magnitude approximately equal to a magnitude of a verify voltage $V_{VFYA}$. The threshold voltages of the memory cells MCI, MCO controlled in a state B are larger than the read voltage $V_{CGBR}$. The smallest threshold voltage included in the threshold distribution of the state B has a magnitude approximately equal to a magnitude of a verify voltage $V_{VFYB}$. The threshold voltages of all of the memory cells MCI, MCO are smaller than a read pass voltage $V_{READ}$.

The data of one bit or a plurality of bits is assigned to each of these threshold distributions.

For example, when 3-bit data is assigned to the memory cells MCI, MCO, the threshold voltages of the memory cells MCI, MCO are controlled to belong to any of $2^3=8$ patterns of the threshold distribution. Any data of "0, 0, 0," "0, 0, 1," "0, 1, 0," "0, 1, 1," "1, 0, 0," "1, 0, 1," "1, 1, 0," and "1, 1, 1" is assigned to these eight patterns of the threshold distribution.

For example, when 1-bit data is assigned to the memory cells MCI, MCO, the threshold voltages of the memory cells MCI, MCO are controlled to belong to any of $2^1=2$ patterns of the threshold distribution. Any data of "0" or "1" is assigned to these two patterns of the threshold distribution.

[Read Operation]

Figure 8:
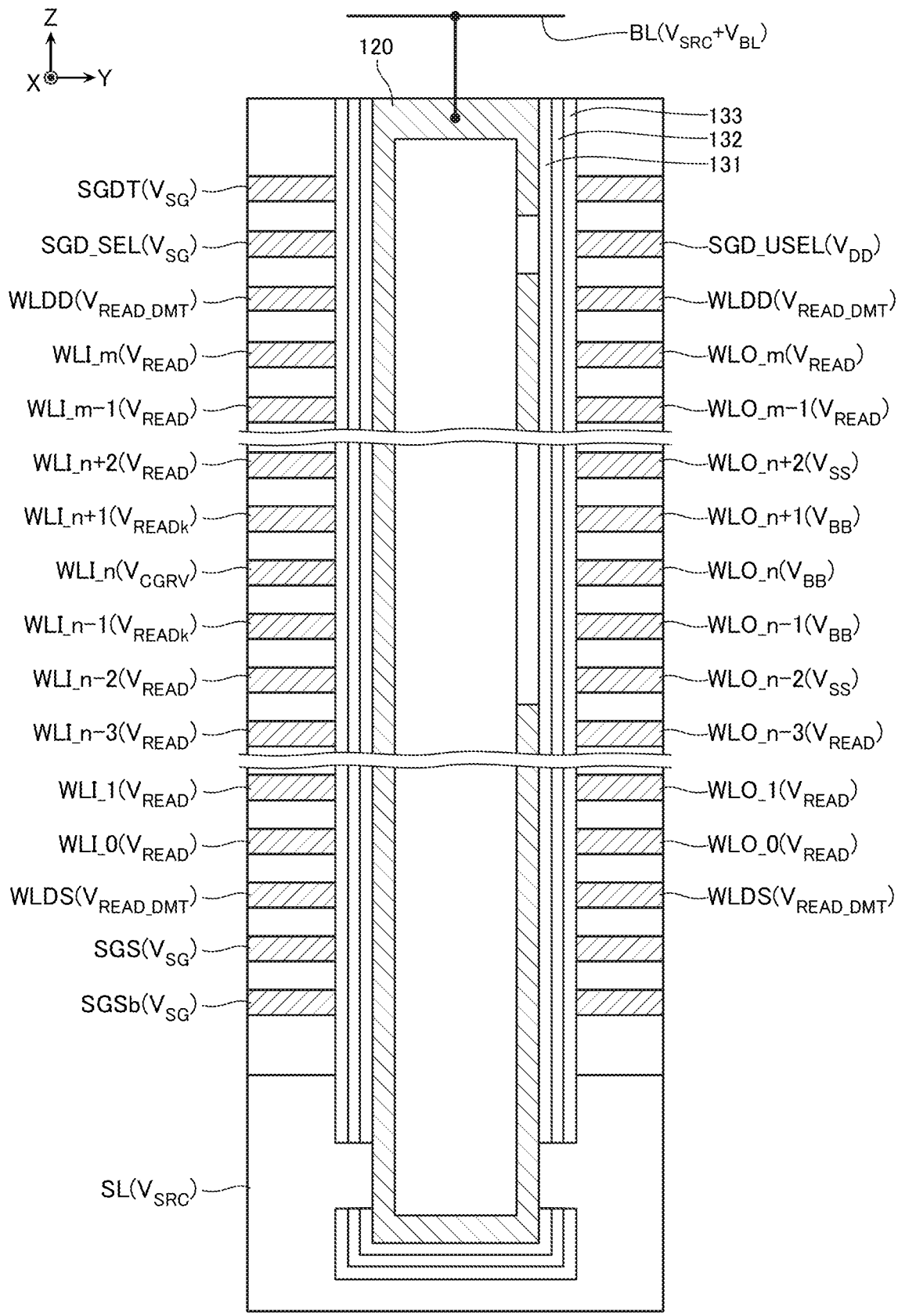
FIG. 8 is a schematic cross-sectional view for describing a read operation of the semiconductor memory device according to the first embodiment.

Next, with reference to FIG. 8, the read operation of the semiconductor memory device according to the embodiment will be described. FIG. 8 is a schematic cross-sectional view for describing the read operation.

The read operation according to the embodiment is collectively executed to all of the memory cells MCI, MCO included in the specified string unit SU of the specified memory block BLK and connected to the specified word line WLI or word line WLO. Hereinafter, the configuration including the plurality of memory cells MCI, MCO is referred to as a page in some cases.

In the following description, an example in which the read operation is executed to the page corresponding to the memory string MSI (FIG. 2) and the word line WLI_n is described. In the following description, among the drain-side select gate lines SGD, the drain-side select gate line SGD corresponding to the selected memory string MSI (FIG. 2) is referred to as a drain-side select gate line SGD_SEL, and the drain-side select gate line SGD corresponding to the unselected memory string MSO is referred to as a drain-side select gate line SGD_USEL in some cases.

In the read operation, for example, as illustrated in FIG. 8, a voltage $V_{SRC}+V_{BL}$ is applied to the bit line BL. A voltage $V_{SRC}$ is applied to the source line SL. The voltage $V_{SRC}$ is larger than the ground voltage $V_{SS}$. The voltage $V_{SRC}+V_{BL}$ is larger than the voltage $V_{SRC}$.

A voltage $V_{SG}$ is applied to the drain-side select gate lines SGDT, SGD_SEL. The voltage $V_{SG}$ is larger than the voltage $V_{SRC}+V_{BL}$. A difference between the voltage $V_{SG}$ and the voltage $V_{SRC}+V_{BL}$ is larger than the threshold voltages for operating the drain-side select transistors STDT, STD as NMOS transistors. Consequently, electron channels are formed in the channel regions of the drain-side select transistors STDT, STD corresponding to the selected memory string MSI.

A voltage $V_{DD}$ is applied to the drain-side select gate line SGD_USEL. The voltage $V_{DD}$ is larger than the voltage $V_{SRC}$. The difference between the voltage $V_{DD}$ and the voltage $V_{SRC}+V_{BL}$ is smaller than the threshold voltage for operating the drain-side select transistor STD as a NMOS transistor. Consequently, the channel is not formed in the channel region of the drain-side select transistor STD corresponding to the unselected memory string MSO.

A voltage $V_{READ\_DMT}$ is applied to the dummy word lines WLDD, WLDS. The voltage $V_{READ\_DMT}$ is larger than the voltage $V_{DD}$ and smaller than the read pass voltage $V_{READ}$. The difference between the voltage $V_{READ\_DMT}$ and the voltage $V_{SRC}+V_{BL}$ is larger than the threshold voltages for operating the dummy memory cells MCDD, MCDS as NMOS transistors. Consequently, the electron channels are formed in the channel regions of the dummy memory cells MCDD, MCDS.

The read pass voltage $V_{READ}$ is applied to the word lines WLI_0 to WLI_n−2, WLI_n+2 to WLI_m. A read pass voltage $V_{READk}$ is applied to the word lines WLI_n−1, WLI_n+1. The read pass voltage $V_{READk}$ is larger than the read pass voltage $V_{READ}$. Consequently, the electron channels are formed in the channel regions of the plurality of unselected memory cells MCI.

A read voltage $V_{CGRV}$ is applied to the selected word line WLI_n. The read voltage $V_{CGRV}$ is, for example, any of the read voltage $V_{CGAR}$, $V_{CGBR}$ described with reference to FIG. 7. Consequently, the electron channel is formed or is not formed in the channel region of the selected memory cell MCI corresponding to the data stored in the selected memory cell MCI.

The read pass voltage $V_{READ}$ is applied to the word lines WLO_0 to WLO_n−3, WLO_n+3 to WLO_m. Consequently, the electron channels are formed in the channel regions of the plurality of unselected memory cells MCO.

The read blocking voltage $V_{BB}$ is applied to the word lines WLO_n−1 to WLO_n+1. The ground voltage $V_{SS}$ is applied to the word lines WLO_n−2, WLO_n+2. Consequently, the channels are not formed in the channel regions of the unselected memory cells MCO connected to them.

The voltage $V_{SG}$ is applied to the source-side select gate lines SGS, SGSb. Consequently, the electron channels are formed in the channel regions of the source-side select transistors STS, STSb.

Here, when the electron channel is formed in the channel region of the selected memory cell MCI, the current flows through the bit line BL. On the other hand, when the electron channel is not formed in the channel region of the selected memory cell MCI, the current does not flow through the bit line BL. In the read operation, it is possible to read out the data of the selected memory cell MCI by detecting the current of the bit line BL by the sense amplifier module SAM (FIG. 1).

In FIG. 8, the read blocking voltage $V_{BB}$ is applied to the word lines WLO_n−1 to WLO_n+1, and the read pass voltage $V_{READ}$ is applied to the word lines WLO_0 to WLO_n−3, WLO_n+3 to WLO_m. However, this configuration is merely an example, and the specific method is adjustable as necessary. For example, the read blocking voltage $V_{BB}$ may be applied to all the word lines WLO_0 to WLO_m.

[Erase Operation]

Figure 9:
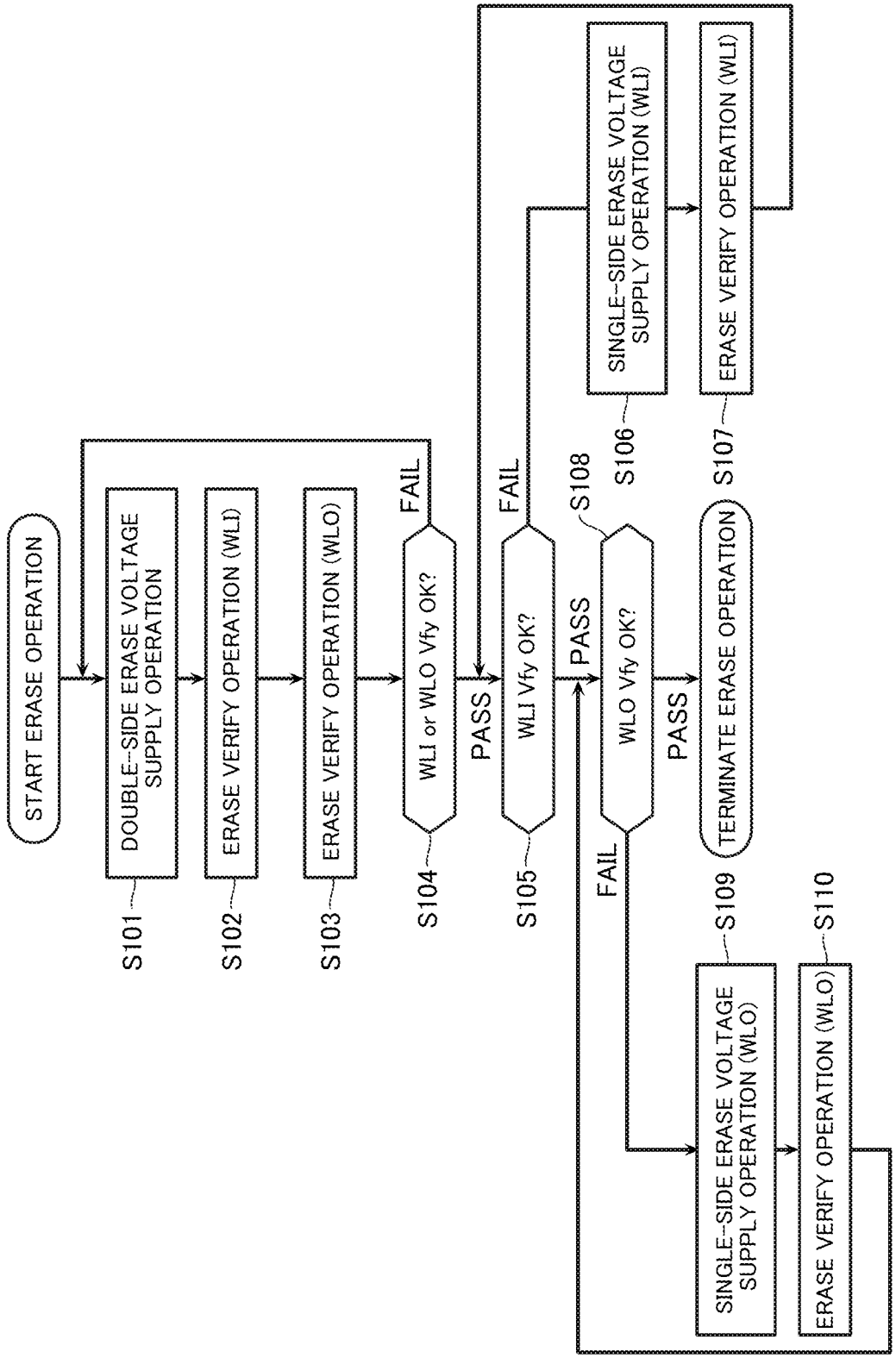
FIG. 9 is a schematic flowchart for describing an erase operation of the semiconductor memory device.

Next, with reference to FIG. 9, the erase operation of the semiconductor memory device according to the embodiment will be described. FIG. 9 is a schematic flowchart for describing the erase operation.

At Step S101, a double-side erase voltage supply operation is executed to the plurality of memory cells MCI, MCO included in the memory block BLK selected as a target of the erase operation (hereinafter referred to as a "selected memory block $BLK_S$"). The double-side erase voltage supply operation is an operation that applies an erase voltage to the plurality of memory cells MCI, MCO to decrease the threshold voltages of the memory cells MCI, MCO.

At Step S102, an erase verify operation is executed to the plurality of memory cells MCI included in the selected memory block $BLK_S$. Consequently, it is determined whether or not the threshold voltages of the memory cells MCI have fallen below the erase verify voltage $V_{VFYEr}$ described with reference to FIG. 7.

At Step S103, the erase verify operation is executed to the plurality of memory cells MCO included in the selected memory block $BLK_S$. Consequently, it is determined whether or not the threshold voltages of the memory cells MCO have fallen below the erase verify voltage $V_{VFYEr}$ described with reference to FIG. 7.

At Step S104, the result of the erase verify operations at Step S102, Step S103 is determined. For example, when a ratio of the memory cells MCI detected as an OFF state at Step S102 is a certain number or more, and the ratio of the memory cells MCO detected as the OFF state at Step S103 is the certain number or more, it is determined as erase verify FAIL, and the process proceeds to Step S101. On the other hand, for example, when the ratio of the memory cells MCI detected as the OFF state at Step S102 is less than the certain number, or the ratio of the memory cells MCO detected as the OFF state at Step S103 is less than the certain number, it is determined as erase verify PASS, and the process proceeds to Step S105.

At Step S105, among the erase verify operations at Step S102 and Step S107, the result of the erase verify operation executed immediately before Step S105 is determined. For example, when the ratio of the memory cells MCI detected as the OFF state at Step S102 or Step S107 is the certain number or more, it is determined as erase verify FAIL, and the process proceeds to Step S106. On the other hand, for example, when the ratio of the memory cells MCI detected as the OFF state at Step S102 or Step S107 is less than the certain number, it is determined as erase verify PASS, and the process proceeds to Step S108.

At Step S106, a single-side erase voltage supply operation is executed to the plurality of memory cells MCI included in the selected memory block $BLK_S$. The single-side erase voltage supply operation at Step S106 is an operation that applies the erase voltage to the plurality of memory cells MCI to decrease the threshold voltages of the memory cells MCI. At Step S106, the application of the erase voltage to the memory cell MCO is inhibited.

At Step S107, similarly to Step S102, the erase verify operation to the memory cells MCI is executed.

At Step S108 (FIG. 9), among the erase verify operations at Step S103 and Step S110, the result of the erase verify operation executed immediately before Step S108 is determined. For example, when the ratio of the memory cells MCO detected as the OFF state at Step S103 or Step S110 is the certain number or more, it is determined as erase verify FAIL, and the process proceeds to Step S109. On the other hand, for example, when the ratio of the memory cells MCO detected as the OFF state at Step S103 or Step S110 is less than the certain number, it is determined as erase verify PASS, and the erase operation is terminated.

At Step S109, the single-side erase voltage supply operation is executed to the plurality of memory cells MCO included in the selected memory block $BLK_S$. The single-side erase voltage supply operation at Step S109 is an operation that applies the erase voltage to the plurality of memory cells MCO to decrease the threshold voltages of the memory cells MCO. At Step S109, the application of the erase voltage to the memory cell MCI is inhibited.

At Step S110, similarly to Step S103, the erase verify operation to the memory cells MCI is executed.

[Double-Side Erase Voltage Supply Operation]

Figure 10:
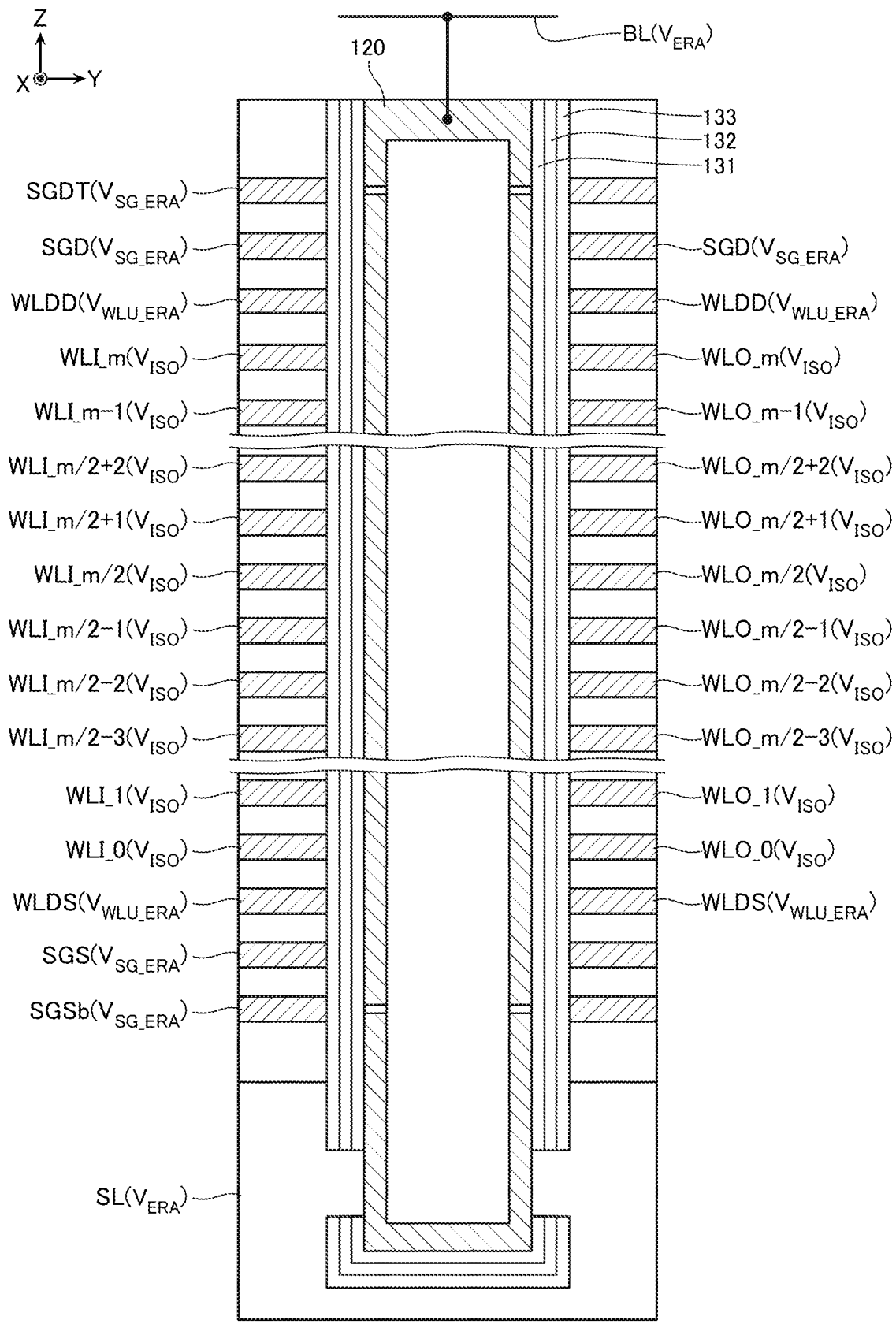
FIG. 10 is a schematic cross-sectional view for describing a double-side erase voltage supply operation.
Figure 11:
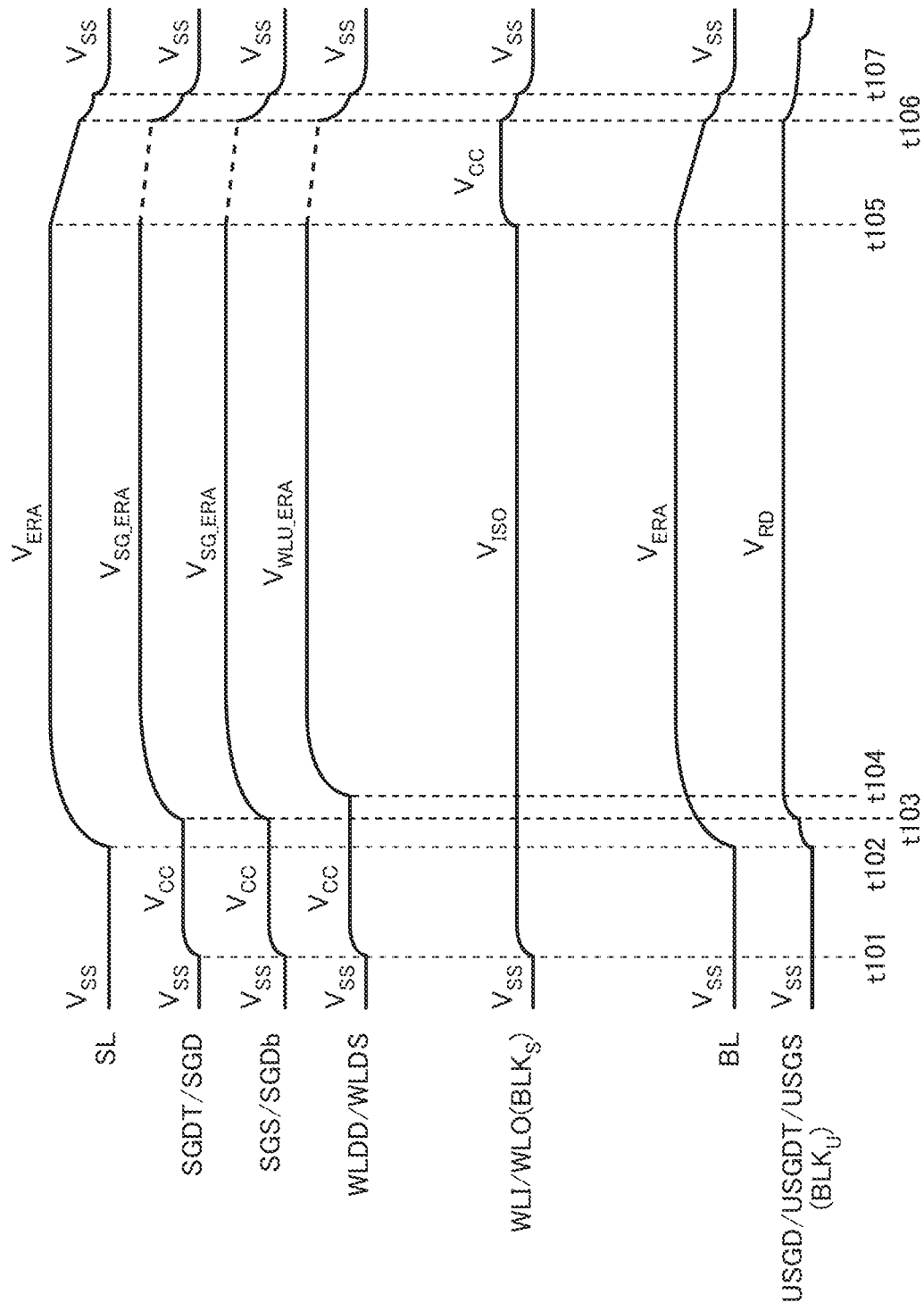
FIG. 11 is a schematic waveform diagram for describing the double-side erase voltage supply operation.

Next, with reference to FIGS. 10 and 11, the double-side erase voltage supply operation will be described. FIG. 10 is a schematic cross-sectional view for describing the double-side erase voltage supply operation. FIG. 11 is a schematic waveform diagram for describing the double-side erase voltage supply operation.

The double-side erase voltage supply operation according to the embodiment is collectively executed to all the memory cells MCI, MCO in the selected memory block $BLK_S$.

In the following description, the memory block BLK other than the selected memory block $BLK_S$ is referred to as an "unselected memory block $BLK_U$" in some cases. The select gate lines SGDT, SGD, SGS, SGSb included in the unselected memory block $BLK_U$ are referred to as "select gate lines USGDT, USGD, USGS, USGSb" or the like in some cases.

At timing t101 of the double-side erase voltage supply operation, a voltage $V_{CC}$ is applied to the select gate lines SGDT, SGD, SGS, SGSb and the dummy word lines WLDD, WLDS. A voltage $V_{ISO}$ is applied to the word lines WLI, WLO. The voltage $V_{CC}$ is smaller than the read pass voltage $V_{READ}$ described with reference to FIG. 7. The voltage $V_{ISO}$ is smaller than the voltage $V_{CC}$.

At timing t102 of the double-side erase voltage supply operation, an erase voltage $V_{ERA}$ is applied to the bit line BL and the source line SL. The erase voltage $V_{ERA}$ is larger than the read pass voltage $V_{READ}$ described with reference to FIG. 7. The difference between the erase voltage $V_{ERA}$ and the voltage $V_{ISO}$ is larger than the threshold voltages for operating the memory cells MCI, MCO as PMOS transistors. Consequently, for example, as illustrated in FIG. 10, hole channels are formed in the channel regions of the memory cells MCI, MCO.

At timing t103 of the double-side erase voltage supply operation, a voltage $V_{SG\_ERA}$ is applied to the select gate lines SGDT, SGD, SGS, SGSb. In this case, the voltages of the select gate lines SGDT, SGD, SGS, SGSb increase such that the differences of the voltages between these and the bit line BL and the source line SL become approximately constant and reach the voltage $V_{SG\_ERA}$. The voltage $V_{SG\_ERA}$ is smaller than the erase voltage $V_{ERA}$. The difference between the voltage $V_{SG\_ERA}$ and the erase voltage $V_{ERA}$ is larger than the threshold voltages for operating the select transistors STDT, STD, STS, STSb as PMOS transistors. Consequently, for example, as illustrated in FIG. 10, the hole channels are formed in the channel regions of the select transistors STDT, STD, STS, STSb.

At timing t103 of the double-side erase voltage supply operation, a voltage $V_{RD}$ is applied to the select gate lines USGDT, USGD, USGS, USGSb. The voltage $V_{RD}$ is smaller than the erase voltage $V_{ERA}$. The difference between the voltage $V_{RD}$ and the erase voltage $V_{ERA}$ is smaller than the threshold voltages for operating the select transistors STDT, STD, STS, STSb as PMOS transistors. Consequently, the channels are not formed in the channel regions of the select transistors STDT, STD, STS, STSb in the unselected memory block $BLK_U$.

At timing t104 of the double-side erase voltage supply operation, a voltage $V_{WLU\_ERA}$ is applied to the dummy word lines WLDD, WLDS. In this case, the voltages of the select gate lines SGDT, SGD, SGS, SGSb increase such that the differences of the voltages between these and the bit line BL and the source line SL become approximately constant and reach the voltage $V_{WLU\_ERA}$. The voltage $V_{WLU\_ERA}$ is smaller than the voltage $V_{SG\_ERA}$ and larger than the voltage $V_{ISO}$. The difference between the voltage $V_{WLU\_ERA}$ and the erase voltage $V_{ERA}$ is larger than the threshold voltages for operating the select transistors STDT, STD, STS, STSb as PMOS transistors. Consequently, for example, as illustrated in FIG. 10, the hole channels are formed in the channel regions of the dummy memory cells MCDD, MCDS.

During a period from timing t104 to timing t105, a relatively large voltage is applied between the drain and the gate of the select transistors STDT, STSb. In association with this, a Gate Induced Drain Leakage (GIDL) occurs in the select transistors STDT, STSb, and the holes are supplied to the channel regions of the memory cells MCI, MCO.

During a period from timing t104 to timing t105, a relatively large voltage is applied between the drain and the gate of the memory cells MCI, MCO. In association with this, the holes in the channel regions of the memory cells MCI, MCO tunnel the tunnel insulating layer 131 (FIG. 5, FIG. 6) by FN tunneling to move to the charge storage layer 132 (FIG. 5, FIG. 6). Consequently, the threshold voltages of the memory cells MCI, MCO decrease.

At timing t105 of the double-side erase voltage supply operation, the source line SL, the bit line BL, the select gate lines SGDT, SGD, SGS, SGSb, and the dummy word lines WLDD, WLDS are discharged. In this case, in the illustrated example, the voltage $V_{CC}$ is applied to the word lines WLI, WLO.

At timing t106 of the double-side erase voltage supply operation, the voltage $V_{CC}$ is applied to the source line SL, the bit line BL, the select gate lines SGDT, SGD, SGS, SGSb, and the dummy word lines WLDD, WLDS.

At timing t107 of the double-side erase voltage supply operation, the ground voltage $V_{SS}$ is applied to the source line SL, the bit line BL, the select gate lines SGDT, SGD, SGS, SGSb, the dummy word lines WLDD, WLDS, and the word lines WLI, WLO.

[Erase Verify Operation]

Next, with reference to FIGS. 12 to 14, the erase verify operation will be described.

The erase verify operation according to the embodiment includes an odd number verify operation and an even number verify operation.

Figure 12:
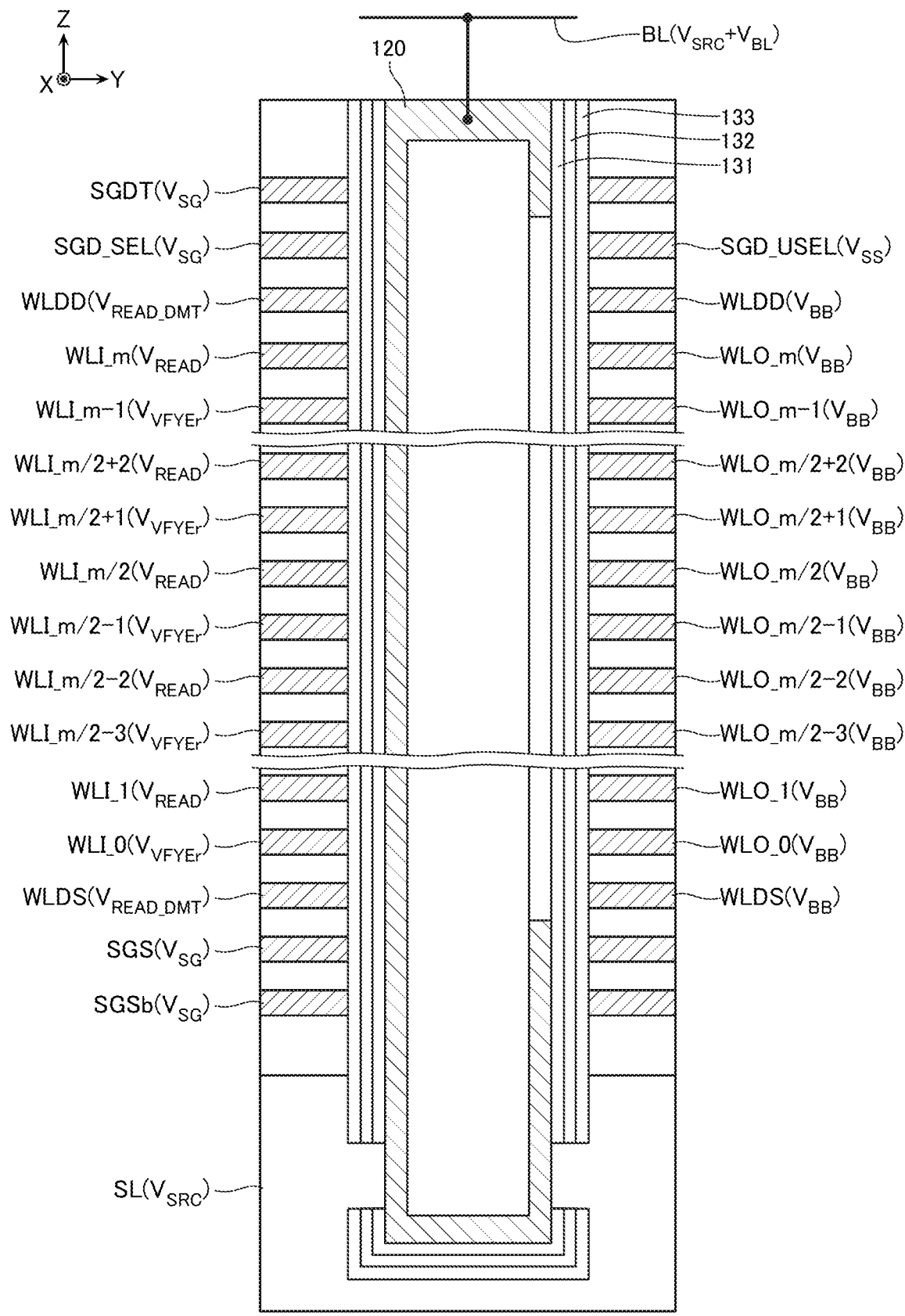
FIG. 12 is a schematic cross-sectional view for describing an odd number verify operation.

FIG. 12 is a schematic cross-sectional view for describing the odd number verify operation. FIG. 12 exemplifies the odd number verify operation relative to the memory cells MCI. The odd number verify operation is an operation detecting states of odd-numbered memory cells MCI, MCO counted from the lower side. The odd number verify operation is executed approximately similarly to the read operation described with reference to FIG. 8. However, as illustrated in FIG. 12, in the odd number verify operation, the erase verify voltage $V_{VFYEr}$ described with reference to FIG. 7 is applied to the odd-numbered memory cells MCI, MCO counted from the lower side, and the read pass voltage $V_{READ}$ described with reference to FIG. 7 is applied to even-numbered memory cells MCI, MCO counted from the lower side. In the odd number verify operation, among the word lines WLI_0 to WLI_m and the word lines WLO_0 to WLO_m, the ones that are not the target of the operation are applied with the read blocking voltage $V_{BB}$. The read blocking voltage $V_{BB}$ is applied to the dummy word lines WLDD, WLDS corresponding to them.

Figure 13:
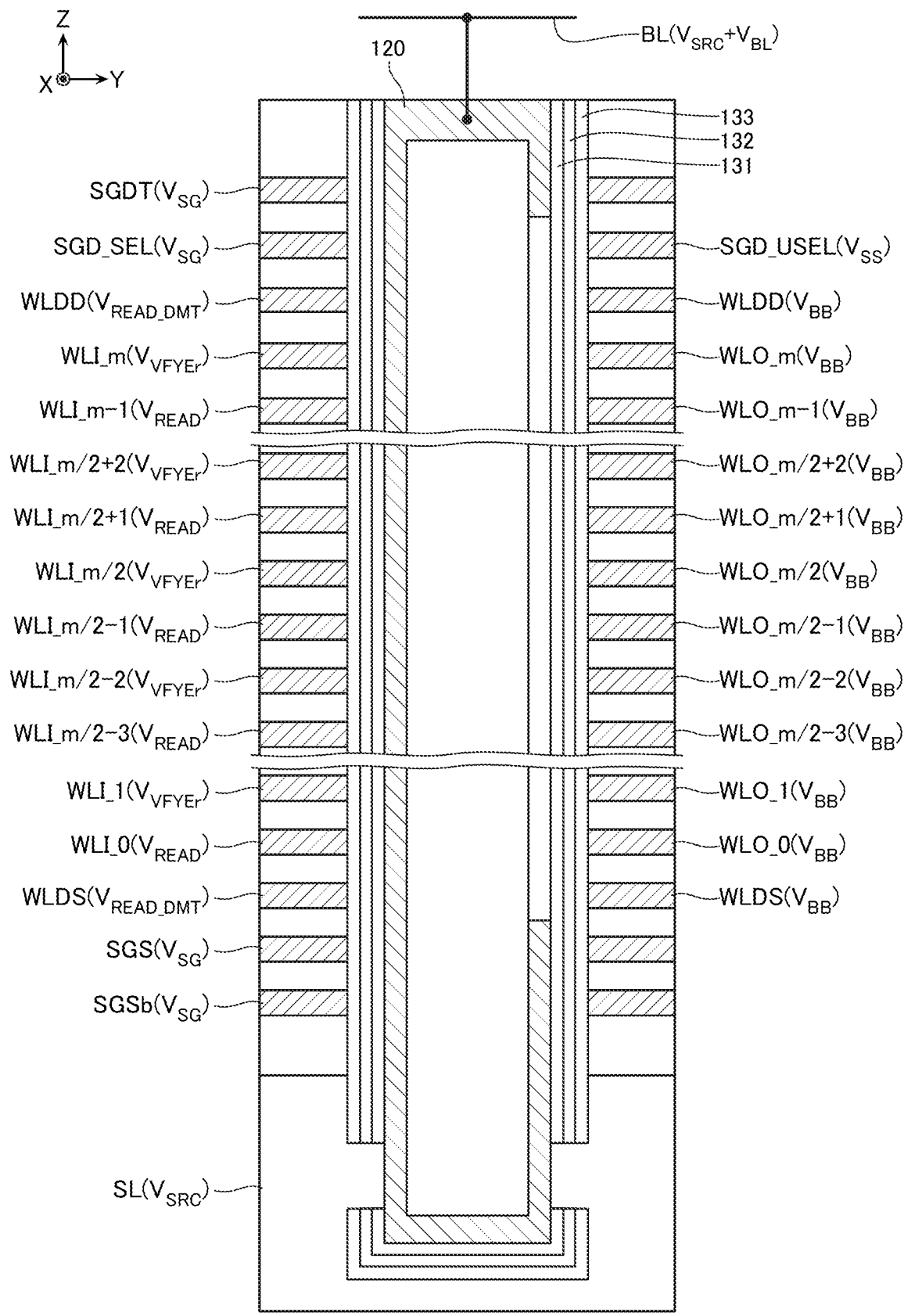
FIG. 13 is a schematic cross-sectional view for describing an even number verify operation.

FIG. 13 is a schematic cross-sectional view for describing the even number verify operation. FIG. 13 exemplifies the even number verify operation relative to the memory cell MCI. The even number verify operation is an operation detecting the states of the even-numbered memory cells MCI, MCO counted from the lower side. The even number verify operation is executed approximately similarly to the read operation described with reference to FIG. 8. However, as illustrated in FIG. 13, in the even number verify operation, the erase verify voltage $V_{VFYEr}$ described with reference to FIG. 7 is applied to the even-numbered memory cells MCI, MCO counted from the lower side, and the read pass voltage $V_{READ}$ described with reference to FIG. 7 is applied to the odd-numbered memory cells MCI, MCO counted from the lower side. In the even number verify operation, among the word lines WLI_0 to WLI_m and the word lines WLO_0 to WLO_m, the ones that are not the target of the operation are applied with the read blocking voltage $V_{BB}$ The read blocking voltage $V_{BB}$ is applied to the dummy word lines WLDD, WLDS corresponding to them.

Figure 14:
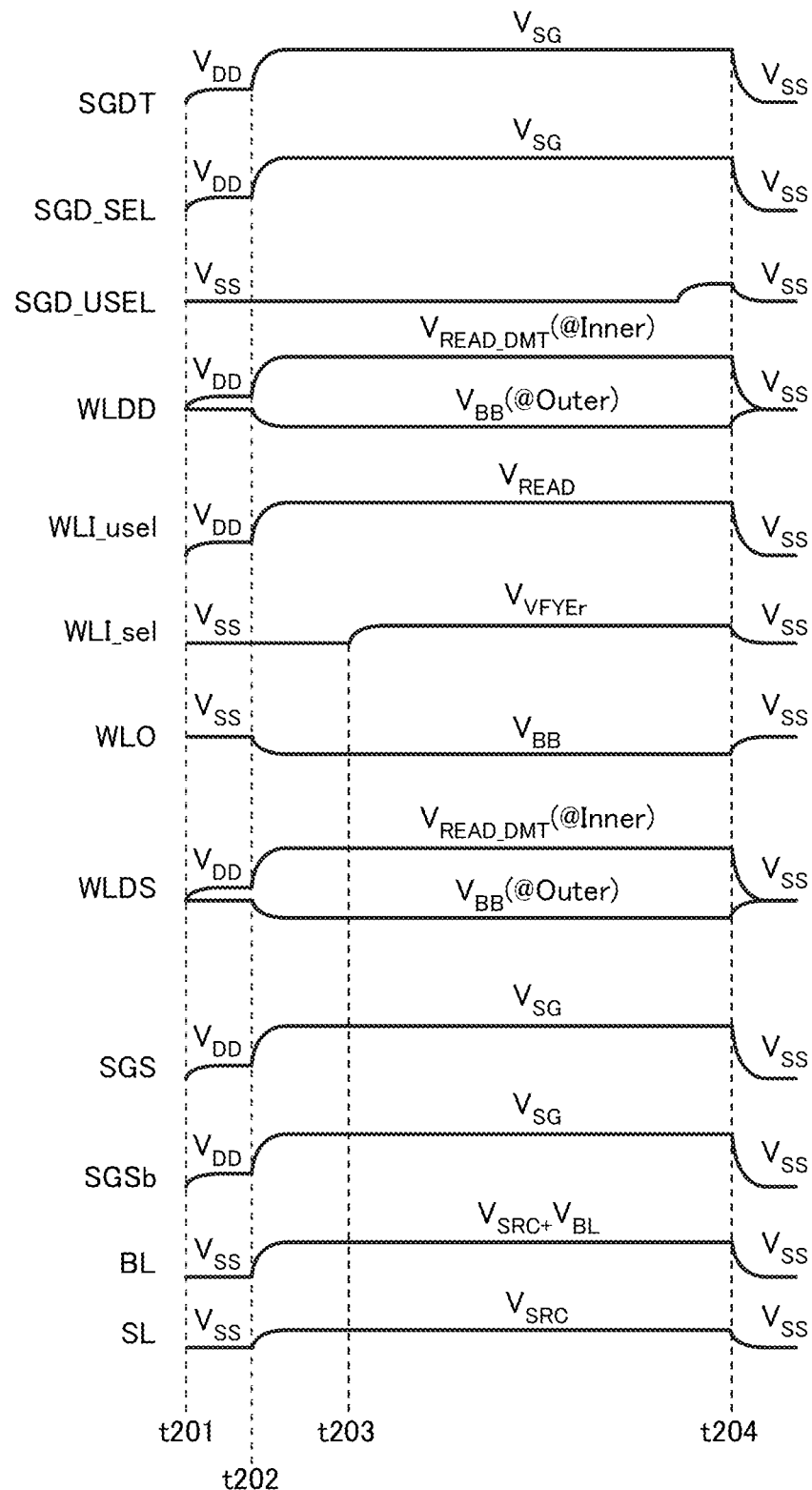
FIG. 14 is a schematic waveform diagram for describing the odd number verify operation and the even number verify operation.

FIG. 14 is a schematic waveform diagram for describing the odd number verify operation and the even number verify operation. FIG. 14 exemplifies the odd number verify operation or the even number verify operation relative to the memory cells MCI. FIG. 14 indicates the voltages of a selected word line WLI_sel and an unselected word line WLI_usel. For example, in the odd number verify operation relative to the memory cell MCI, odd-numbered word lines WLI counted from the lower side are the selected word lines WLI_sel, and even-numbered word lines WLI counted from the lower side are the unselected word lines WLI_usel. For example, in the even number verify operation relative to the memory cells MCI, the even-numbered word lines WLI counted from the lower side are the selected word lines WLI_sel, and the odd-numbered word lines WLI counted from the lower side are the unselected word lines WLI_usel.

At timing t201 of the odd number verify operation and the even number verify operation, the voltage $V_{DD}$ is applied to the select gate lines SGDT, SGD_SEL, SGS, SGSb, the dummy word lines WLDD, WLDS, and the unselected word lines WLI_usel.

At timing t202 of the odd number verify operation and the even number verify operation, the voltages described with reference to FIG. 12 or FIG. 13 are applied to the respective wirings other than the selected word lines WLI_sel.

At timing t203 of the odd number verify operation and the even number verify operation, the erase verify voltage $V_{VFYEr}$ is applied to the selected word lines WLI_sel.

At timing t204 of the odd number verify operation and the even number verify operation, the ground voltage $V_{SS}$ is applied to the respective wirings.

[Single-Side Erase Voltage Supply Operation]

Figure 15:
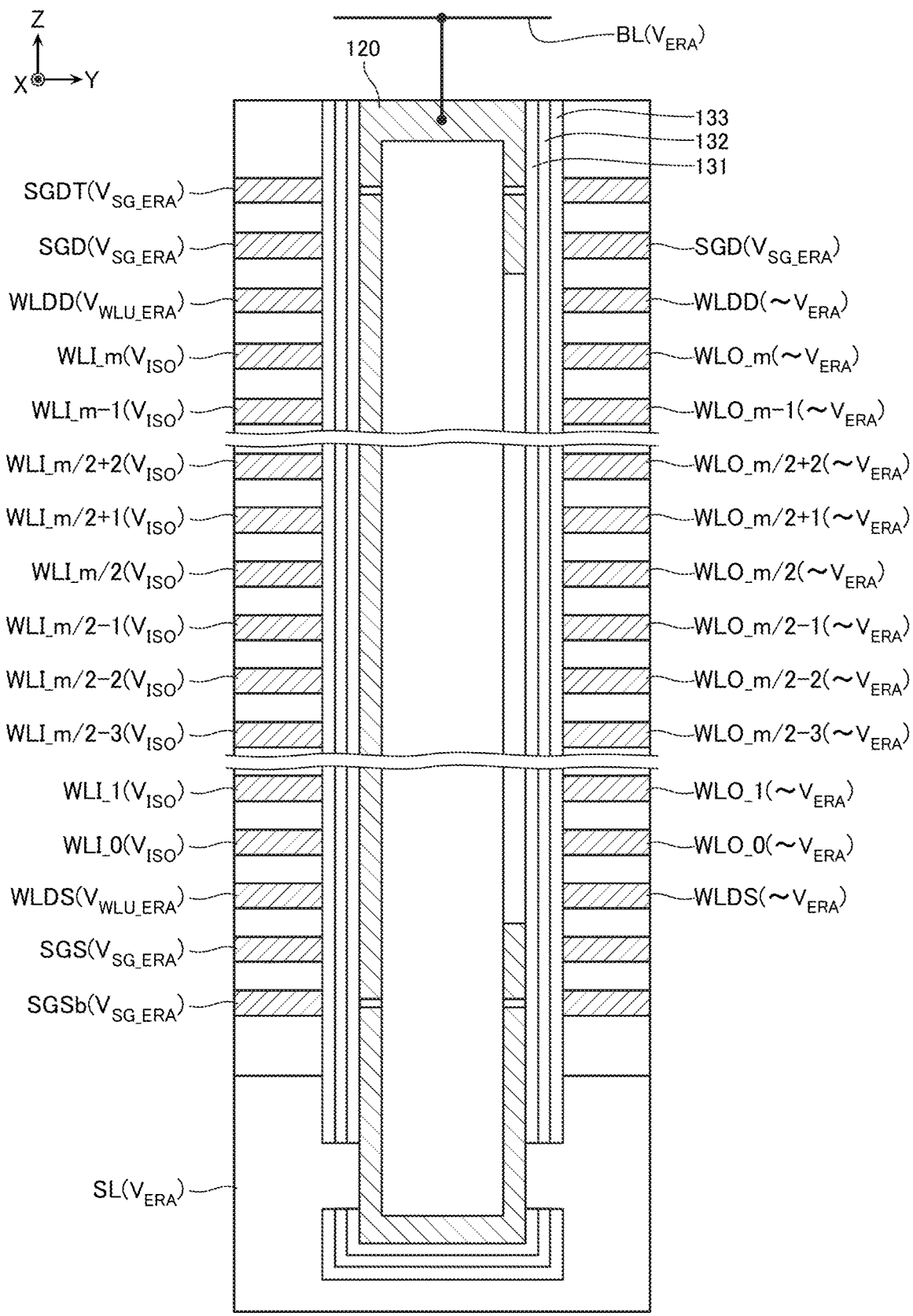
FIG. 15 is a schematic cross-sectional view for describing a single-side erase voltage supply operation.
Figure 16:
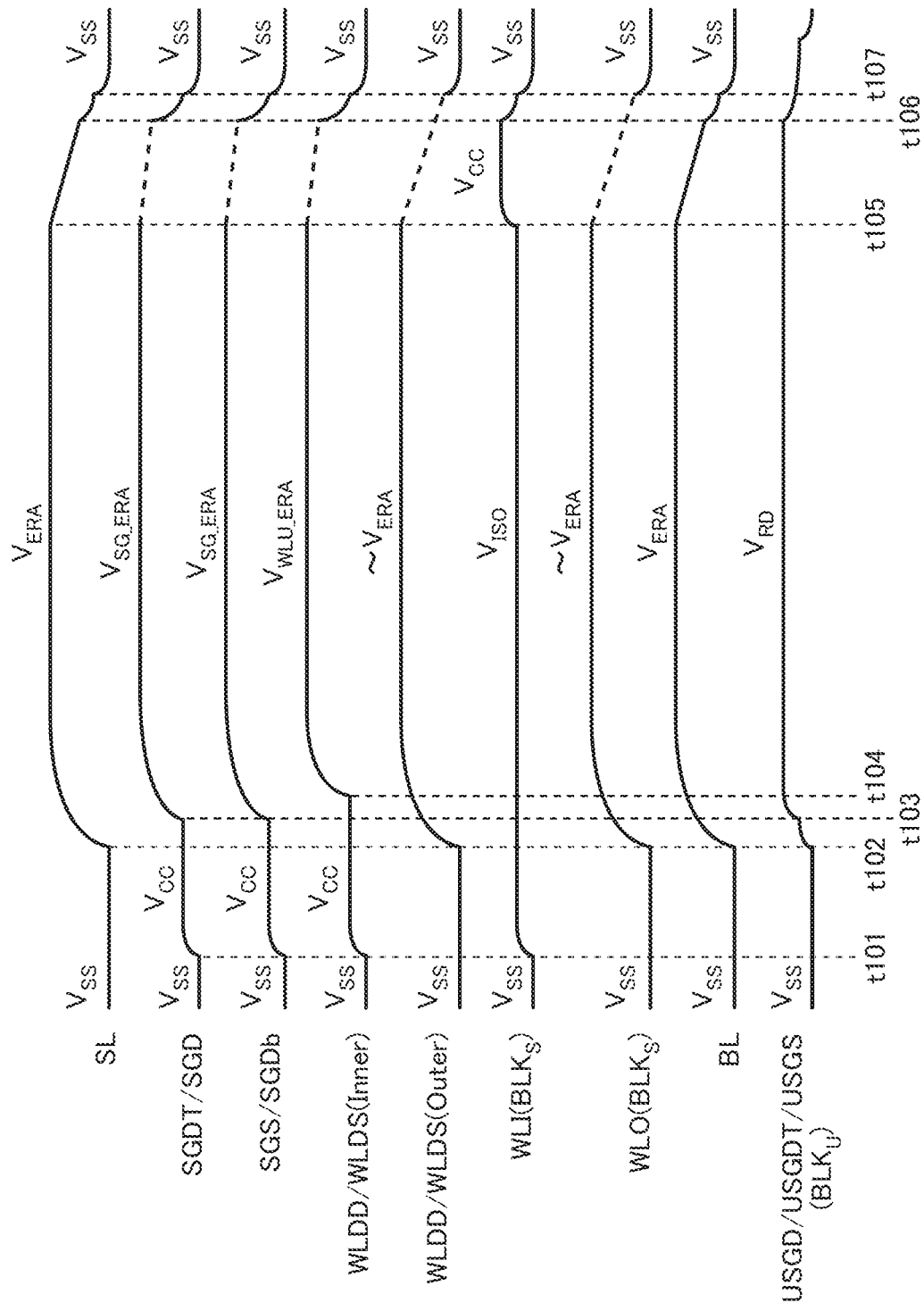
FIG. 16 is a schematic waveform diagram for describing the single-side erase voltage supply operation.

Next, with reference to FIGS. 15 and 16, the single-side erase voltage supply operation will be described. FIG. 15 is a schematic cross-sectional view for describing the single-side erase voltage supply operation. FIG. 16 is a schematic waveform diagram for describing the single-side erase voltage supply operation. FIGS. 15 and 16 exemplify the single-side erase voltage supply operation relative to the memory cells MCI.

The single-side erase voltage supply operation according to the embodiment is collectively executed with respect to all the memory cells MCI in the specified memory block BLK or all the memory cells MCO in the specified memory block BLK.

The single-side erase voltage supply operation is executed approximately similarly to the double-side erase voltage supply operation described with reference to FIGS. 10 and 11. However, as illustrated in FIGS. 15 and 16, in the single-side erase voltage supply operation, among the word lines WLI_0 to WLI_m and the word lines WLO_0 to WLO_m, the ones that are not the target of the operation are applied with the erase voltage $V_{ERA}$ or the voltage close to the erase voltage $V_{ERA}$. The erase voltage $V_{ERA}$ or the voltage close to the erase voltage $V_{ERA}$ is applied to the dummy word lines WLDD, WLDS corresponding to these.

Here, in the single-side erase voltage supply operation, a relatively large voltage is applied between the channels and gates of one of the memory cells MCI and the memory cells MCO. In association with this, the holes in the channel regions of one of the memory cells MCI and the memory cells MCO tunnel the tunnel insulating layer 131 by the FN tunneling to move to the charge storage layer 132. Consequently, the threshold voltages of one of the memory cells MCI and the memory cells MCO decrease.

On the other hand, in the single-side erase voltage supply operation, such a large voltage is not applied between the channels and the gates of the other of the memory cells MCI and memory cells MCO. Accordingly, in the other of the memory cells MCI and memory cells MCO, the FN tunneling of the holes does not occur. Consequently, the threshold voltages of the other of the memory cells MCI and memory cells MCO do not decrease.

Comparative Example

Figure 17:
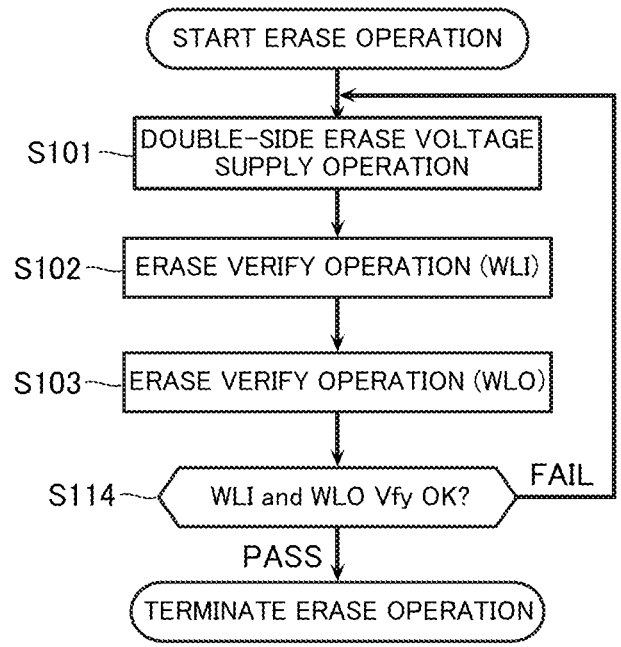
FIG. 17 is a schematic flowchart for describing the erase operation according to a comparative example.

Next, with reference to FIG. 17, an erase operation according to the comparative example will be described. FIG. 17 is a schematic flowchart for describing the erase operation according to the comparative example.

In the rase operation according to the comparative example, Step S114 is executed instead of Step S104. At Step S114, for example, when the ratio of the memory cells MCI detected as the OFF state at Step S102 is the certain number or more, or the ratio of the memory cells MCO detected as the OFF state at Step S103 is the certain number or more, it is determined as erase verify FAIL, and process proceeds to Step S101. On the other hand, for example, when the ratio of the memory cells MCI detected as the OFF state at Step S102 is less than the certain number, and the ratio of the memory cells MCO detected as the OFF state at Step S103 is less than the certain number, it is determined as erase verify PASS.

In the erase operation according to the comparative example, the processes from Step S105 to Step S110 described with reference to FIG. 9 or the like are not executed. Consequently, when it is determined as erase verify PASS at Step S114, the erase operation is terminated.

[Effect]

Figure 18:
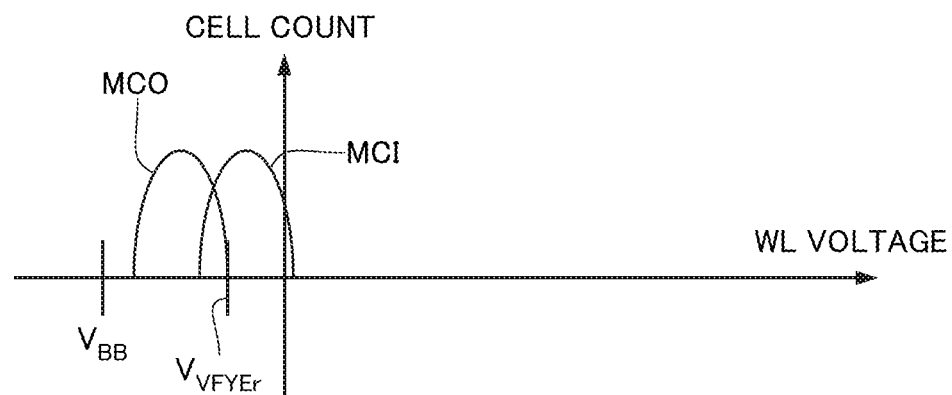
FIG. 18 is a schematic histogram for describing a change of the threshold voltages of the memory cells MCI, MCO by the erase operation.

For example, as illustrated in FIG. 18, in the selected memory block $BLK_S$, assume a case where the threshold voltages of the plurality of memory cells MCO are distributed in a range lower than the threshold voltages of the plurality of memory cells MCI.

Figure 19:
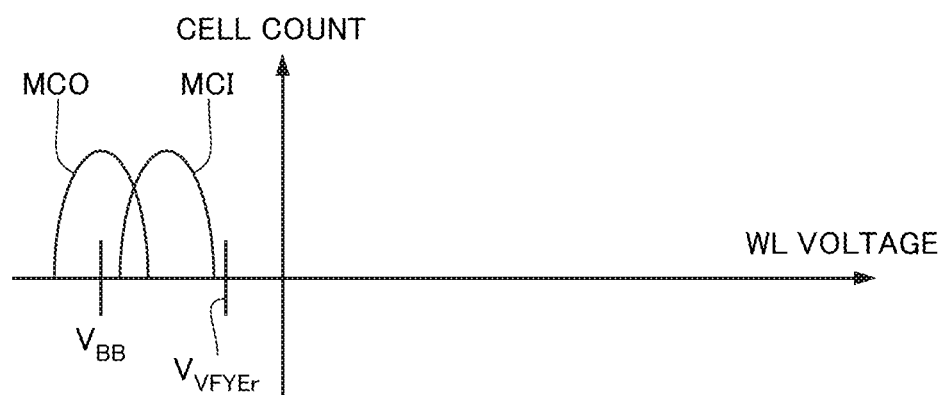
FIG. 19 is a schematic histogram for describing a change of the threshold voltages of the memory cells MCI, MCO by the erase operation.

In the erase operation (FIG. 17) according to the comparative example, the threshold voltages of both the memory cells MCI, MCO decrease until both the memory cells MCI, MCO become the erase verify PASS. Consequently, when the erase operation according to the comparative example is executed with respect to the selected memory block $BLK_S$ in the state as illustrated in FIG. 18, for example, as illustrated in FIG. 19, the threshold voltages of the memory cells MCO are likely to become smaller than necessary. In this case, the voltages of some memory cells MCO are likely to fall below the read blocking voltage $V_{BB}$.

Here, as described with reference to FIG. 8, in the read operation, the read blocking voltage $V_{BB}$ is applied to the gate electrode of the unselected memory cell MCO (hereinafter referred to as a "back surface memory cell MCO" in some cases) that corresponds to the same semiconductor layer 120 as the selected memory cell MCI and is disposed at the same height position as the selected memory cell MCI, and, consequently, the back surface memory cell MCO is set to the OFF state. However, when the threshold voltage of the back surface memory cell MCO is fallen below the read blocking voltage $V_{BB}$, the back surface memory cell MCO cannot be set to the OFF state. In this case, regardless of whether the selected memory cell MCI is in the ON state or in the OFF state, the bit line BL electrically conducts with the source line SL via the back surface memory cell MCO, and the current flows through the bit line BL in some cases. Consequently, the threshold voltage of the selected memory cell MCI cannot be preferably detected in some cases.

Figure 20:
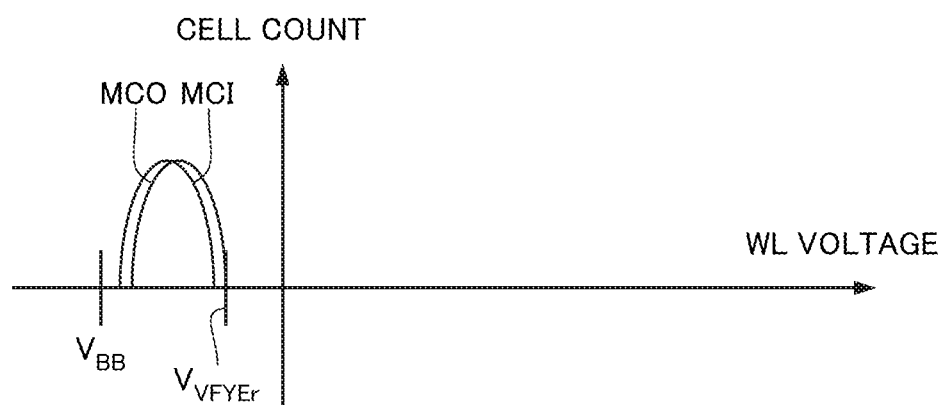
FIG. 20 is a schematic histogram for describing a change of the threshold voltages of the memory cells MCI, MCO by the erase operation.

Here, in the erase operation according to the first embodiment (FIG. 9), at a time point when one of the memory cells MCI, MCO becomes erase verify PASS, the application of the erase voltage $V_{ERA}$ to one of the memory cells MCI, MCO is inhibited, and the erase voltage $V_{ERA}$ is applied only to the other of the memory cells MCI, MCO. Therefore, when the erase operation according to the first embodiment is executed with respect to the selected memory block $BLK_S$ in the state illustrated in FIG. 18, for example, as illustrated in FIG. 20, only the threshold voltages of the memory cells MCI can be preferably adjusted.

In the erase operation according to the first embodiment (FIG. 9), when the verify operation corresponding to one of the memory cells MCI, MCO becomes in the PASS state, in the subsequent operations, the verify operation relative to one of the memory cells MCI, MCO is omitted. Therefore, the erase operation according to the first embodiment can be executed at a higher speed compared with the erase operation according to the comparative example.

Second Embodiment

Figure 21:
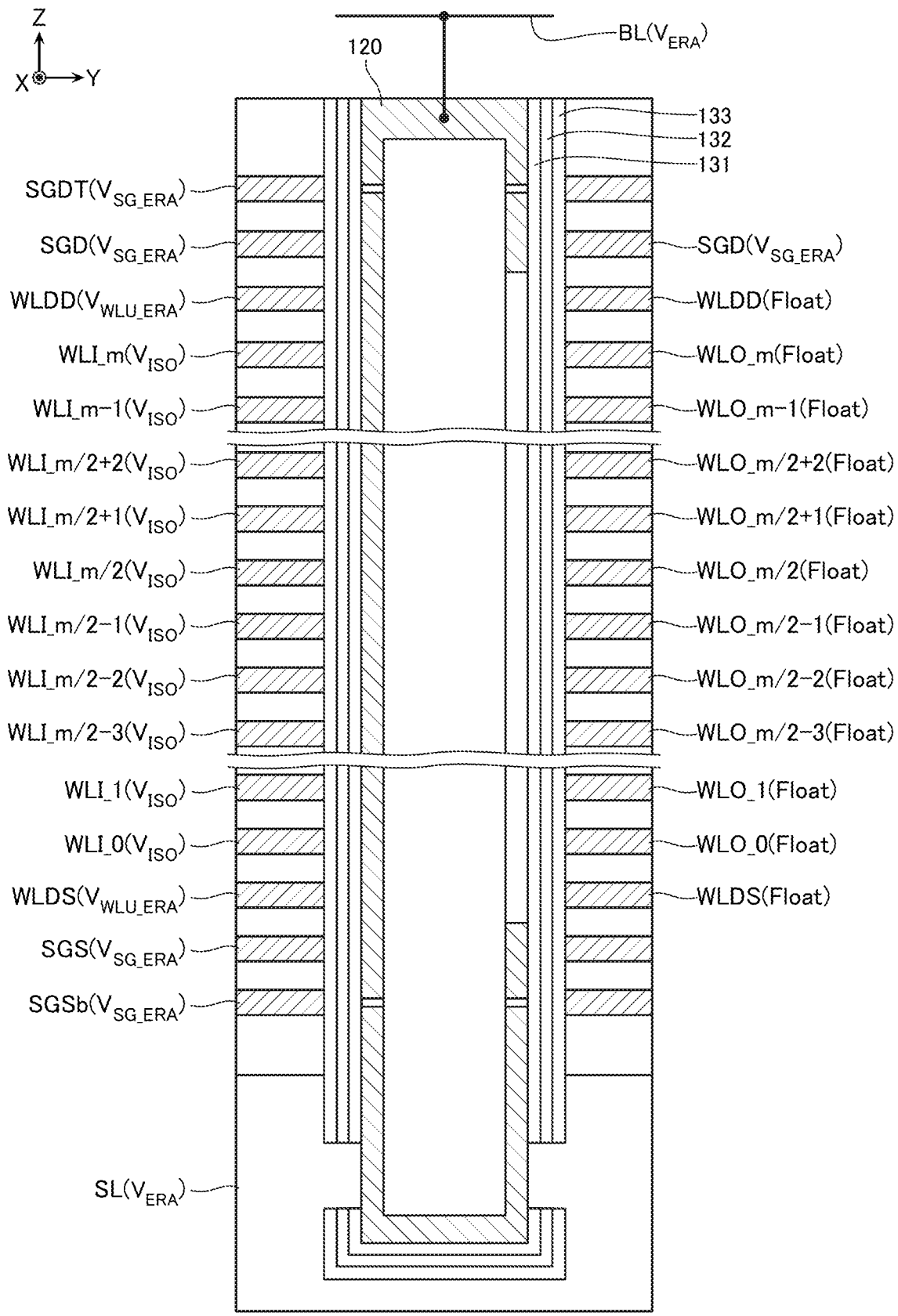
FIG. 21 is a schematic cross-sectional view for describing a single-side erase voltage supply operation according to a second embodiment.
Figure 22:
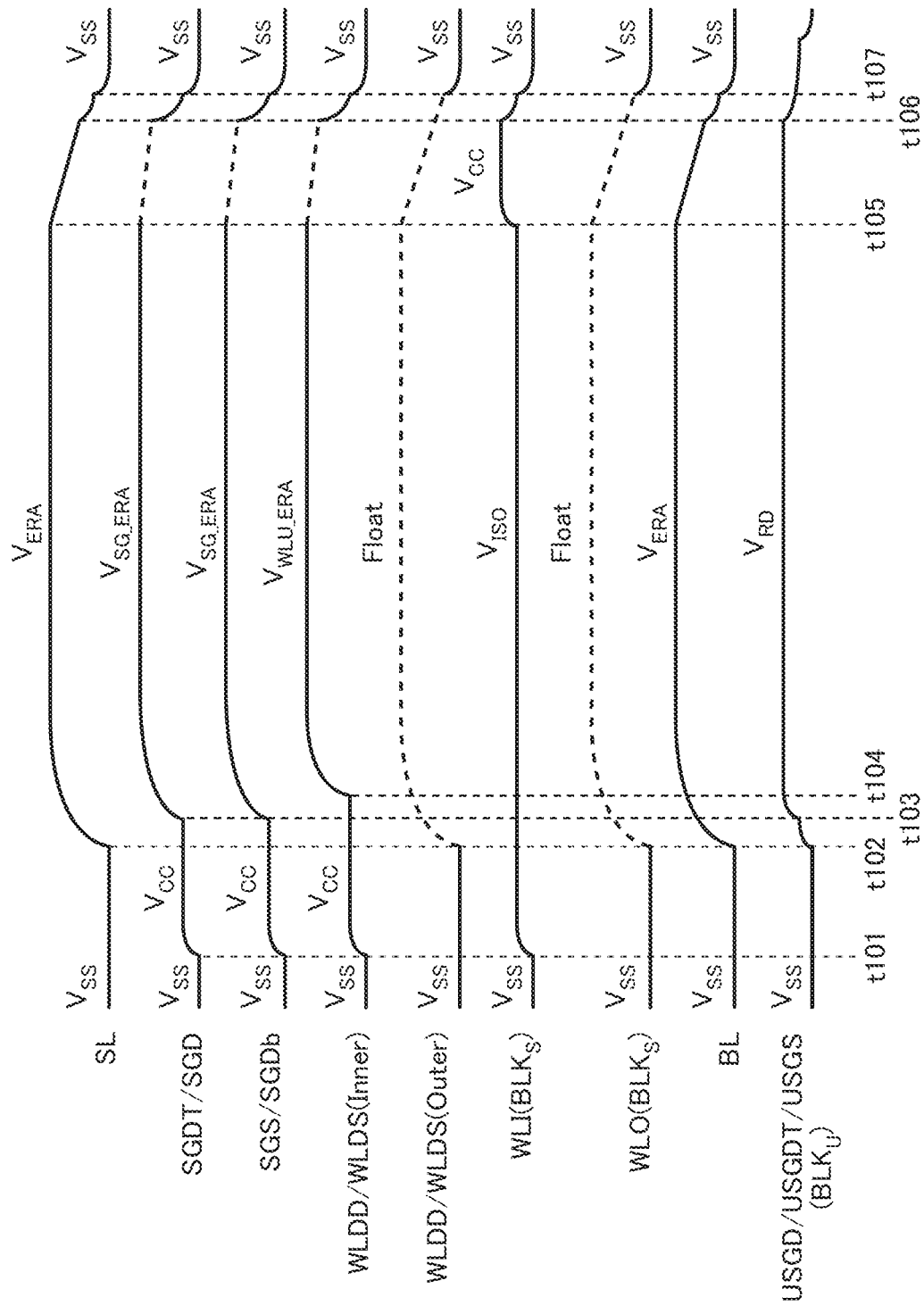
FIG. 22 is a schematic waveform diagram for describing the single-side erase voltage supply operation according to the second embodiment.

Next, with reference to FIGS. 21 and 22, a semiconductor memory device according to the second embodiment will be described. FIG. 21 is a schematic cross-sectional view for describing a single-side erase voltage supply operation of the semiconductor memory device according to the second embodiment. FIG. 22 is a schematic waveform diagram for describing the single-side erase voltage supply operation according to the second embodiment.

The semiconductor memory device according to the second embodiment is basically configured similarly to the semiconductor memory device according to the first embodiment. However, an erase operation according to the second embodiment is different from the erase operation according to the first embodiment. The erase operation according to the second embodiment is basically executed similarly to the erase operation according to the first embodiment. However, the single-side erase voltage supply operation according to the second embodiment is different from the single-side erase voltage supply operation according to the first embodiment. The single-side erase voltage supply operation according to the second embodiment is basically executed approximately similarly to the single-side erase voltage supply operation according to the first embodiment.

However, as described with reference to FIGS. 15 and 16, in the single-side erase voltage supply operation according to the first embodiment, among the word lines WLI_0 to WLI_m and the word lines WLO_0 to WLO_m, the ones that are not the target of the operation are applied with the erase voltage $V_{ERA}$ or the voltage close to the erase voltage $V_{ERA}$. The erase voltage $V_{ERA}$ or the voltage close to the erase voltage $V_{ERA}$ is applied to the dummy word lines WLDD, WLDS corresponding to them.

On the other hand, as illustrated in FIGS. 21 and 22, in the single-side erase voltage supply operation according to the second embodiment, among the word lines WLI_0 to WLI_m and the word lines WLO_0 to WLO_m, the ones that are not the target of the operation are not applied with a fixed voltage, and, among the word lines WLI_0 to WLI_m and the word lines WLO_0 to WLO_m, the ones that are not the target of the operation are set to the floating state. Instead of applying the fixed voltage to the dummy word lines WLDD, WLDS corresponding to them, the dummy word lines WLDD, WLDS corresponding to them are set to the floating state.

A method to set the word lines WLI_0 to WLI_m, WLO_0 to WLO_m, and the dummy word lines WLDD, WLDS to the floating state is adjustable as necessary.

For example, in the example in FIG. 21, all the word lines WLI_0 to WLI_m or all the word lines WLO_0 to WLO_m, and the dummy word lines WLDD, WLDS are set to the floating state. In this case, for example, in all current paths for applying the voltage to the word lines WLI_0 to WLI_m, WLO_0 to WLO_m, and the dummy word lines WLDD, WLDS, it is considered that at least one of the plurality of transistors disposed in the current path is set to the OFF state. For example, in the example in FIG. 3, all the current paths for applying the voltage to the word lines WLI_0 to WLI_m, WLO_0 to WLO_m, and the dummy word lines WLDD, WLDS are all the current paths between the word lines WLI_0 to WLI_m, WLO_0 to WLO_m, and the dummy word lines WLDD, WLDS and the voltage generation circuit VG (FIG. 3) and all the current paths between the word lines WLI_0 to WLI_m, WLO_0 to WLO_m, and the dummy word lines WLDD, WLDS and the bonding pad electrode P (FIG. 3) to which the ground voltage $V_{SS}$ is applied.

Here, the plurality of transistors $T_{BLK}$ connected to the signal supply lines BLKSEL are disposed in all the current paths for applying the voltage to the word lines WLI_0 to WLI_m, WLO_0 to WLO_m, and the dummy word lines WLDD, WLDS. Therefore, in all the current paths for applying the voltage to the word lines WLI_0 to WLI_m, WLO_0 to WLO_m, and the dummy word lines WLDD, WLDS, to set at least one of the plurality of transistors disposed in the current paths to the OFF state, for example, the signal supply line BLKSEL (FIG. 3) in the row decoder RD corresponding to the selected memory block $BLK_S$, the word lines WLI_0 to WLI_m, WLO_0 to WLO_m, and the dummy word lines WLDD, WLDS may be set to "L" state.

For example, the plurality of transistors $T_{WL}$ connected to the plurality of signal supply lines $WLSEL_S$ and the plurality of signal supply lines $WLSEL_U$ are disposed in all the current paths for applying the voltage to the word lines WLI_0 to WLI_m, WLO_0 to WLO_m, and the dummy word lines WLDD, WLDS. Therefore, in all the current paths for applying the voltage to the word lines WLI_0 to WLI_m, WLO_0 to WLO_m, and the dummy word lines WLDD, WLDS, to set at least one of the plurality of transistors disposed in the current paths to the OFF state, for example, all the signal supply lines $WLSEL_S$ and the signal supply lines $WLSEL_U$ in the row decoder RD may be set to the "L" state.

For example, the plurality of transistors $T_{DRV}$ connected to the plurality of signal supply lines VSEL are disposed in all the current paths for applying the voltage to the word lines WLI_0 to WLI_m, WLO_0 to WLO_m, and the dummy word lines WLDD, WLDS. Therefore, in all the current paths for applying the voltage to the word lines WLI_0 to WLI_m, WLO_0 to WLO_m, and the dummy word lines WLDD, WLDS, to set at least one of the plurality of transistors disposed in the current paths to the OFF state, for example, all the signal supply lines VSEL in the row decoder RD may be set to the "L" state.

For example, it is possible that the fixed voltage is applied to the dummy word lines WLDD, WLDS, and the word lines WLI_0 to WLI_m, WLO_0 to WLO_m are set to the floating state, or only a part of the word lines WLI_0 to WLI_m, WLO_0 to WLO_m are set to the floating state. In this case, for example, it is possible that the dummy word lines WLDD, WLDS are electrically conducted to the voltage generation circuit VG, or only a part of the dummy word lines WLDD, WLDS and the word lines WLI_0 to WLI_m, WLO_0 to WLO_m are electrically conducted to the voltage generation circuit VG. In at least a part of the current paths between the word lines WLI_0 to WLI_m, WLO_0 to WLO_m and the voltage generation circuit VG (FIG. 3) and at least a part of the current paths between the word lines WLI_0 to WLI_m, WLO_0 to WLO_m and the bonding pad electrode P (FIG. 3) to which the ground voltage $V_{SS}$ is applied, it is considered that at least one of the plurality of transistors disposed in the current paths is set to the OFF state.

Third Embodiment

Figure 23:
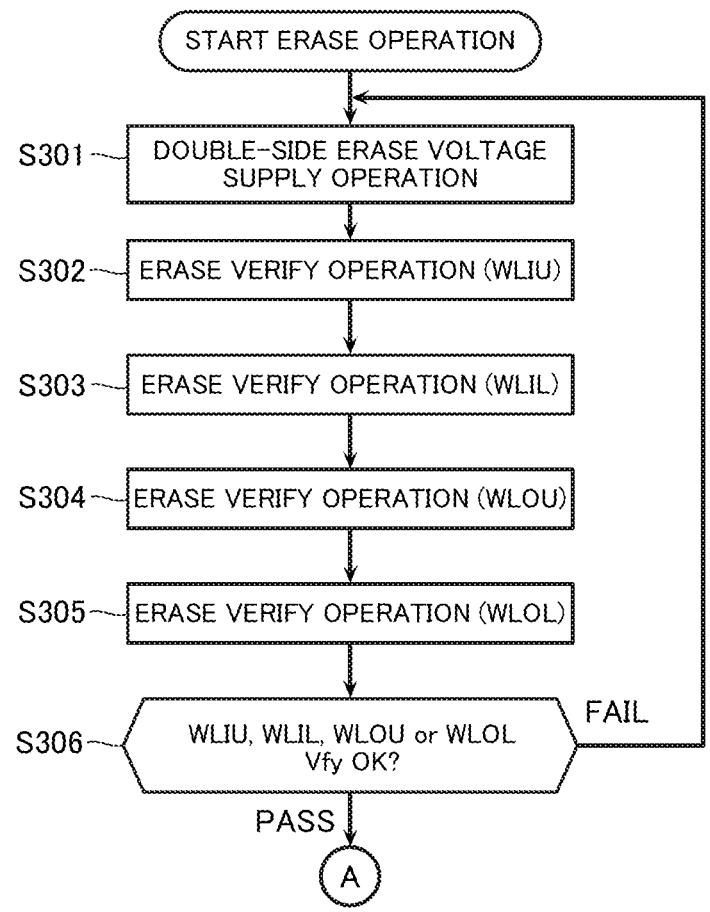
FIG. 23 is a schematic flowchart for describing an erase operation according to a third embodiment.
Figure 24:
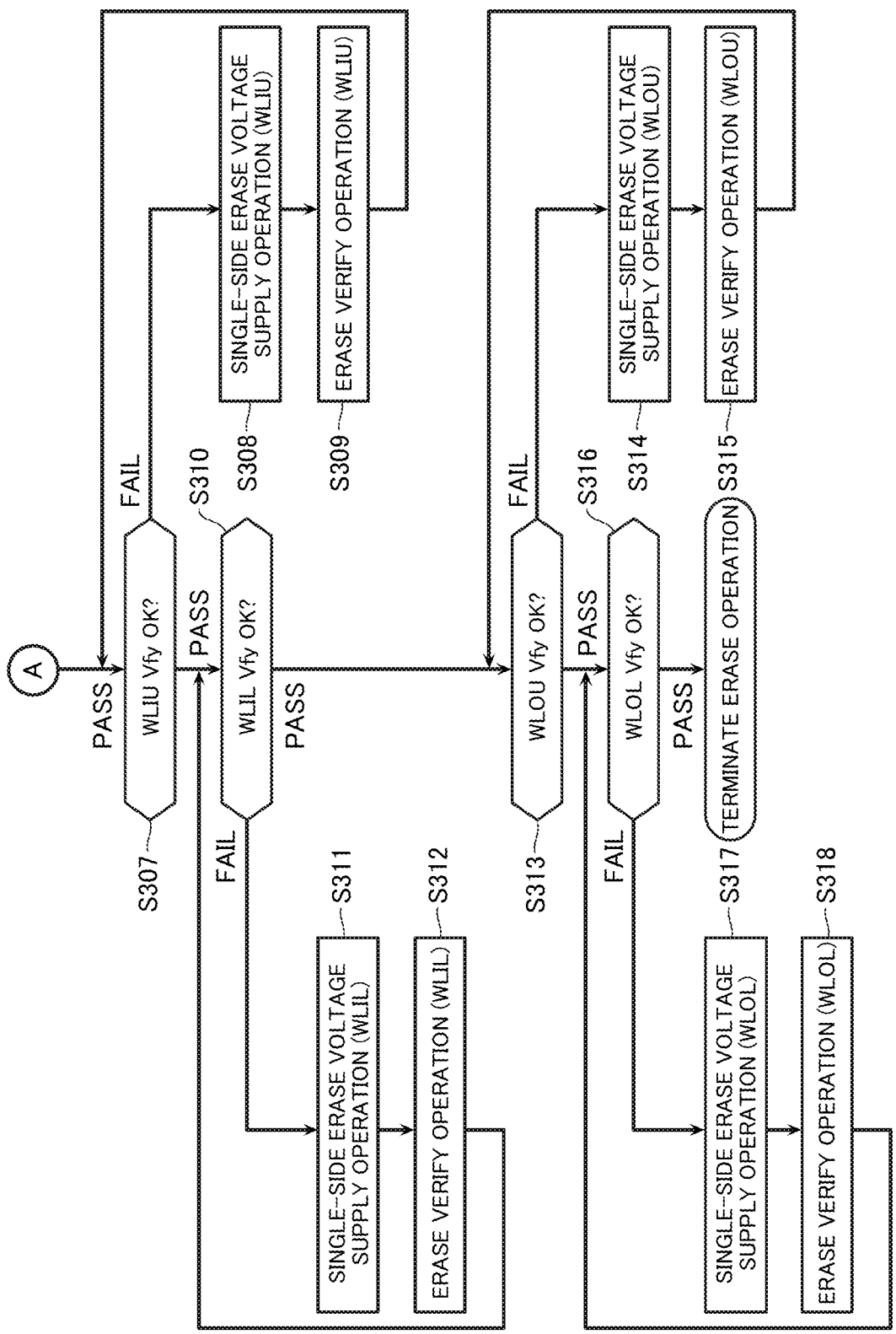
FIG. 24 is a schematic flowchart for describing the erase operation according to the third embodiment.
Figure 25:
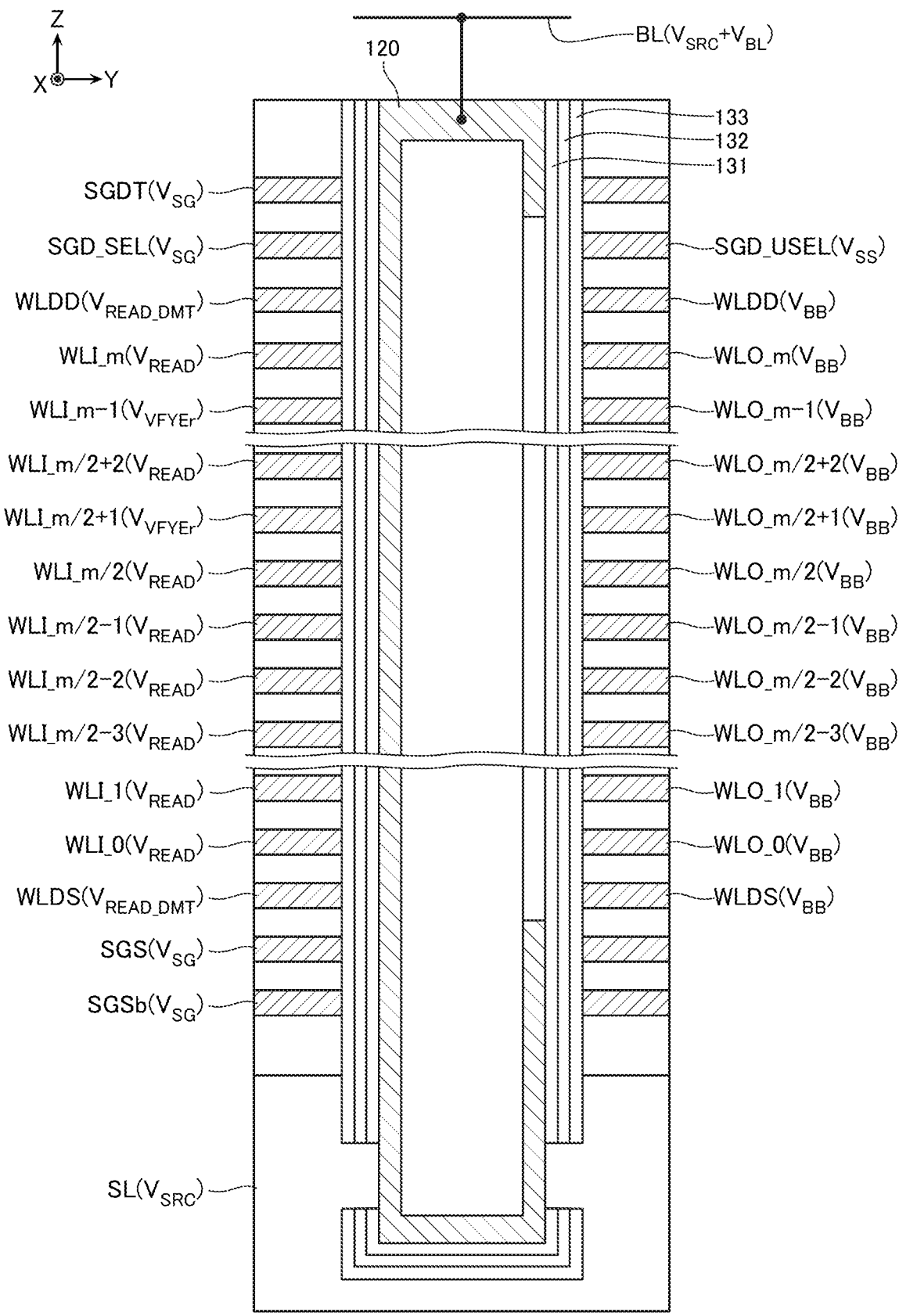
FIG. 25 is a schematic cross-sectional view for describing an erase verify operation according to the third embodiment.
Figure 26:
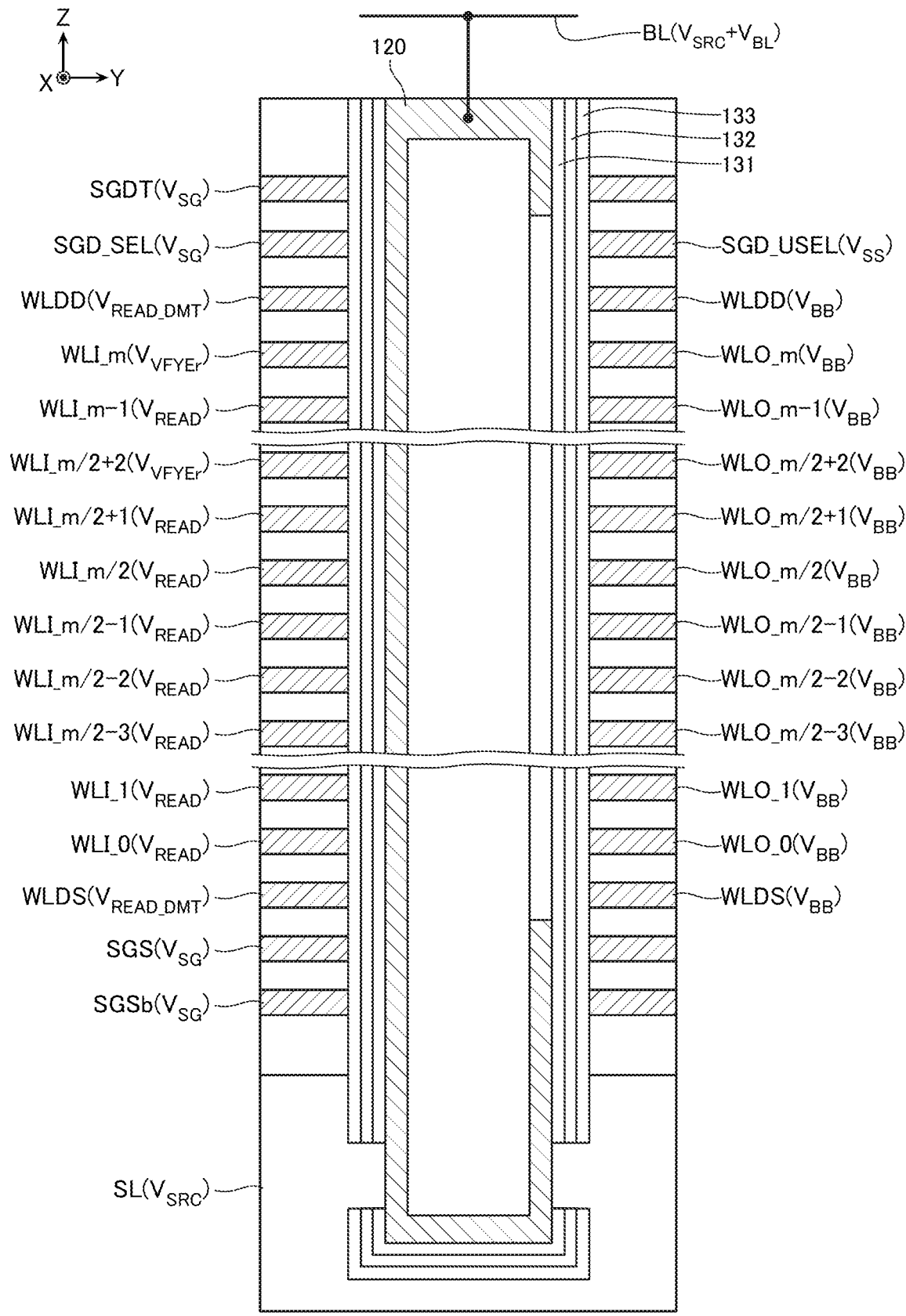
FIG. 26 is a schematic cross-sectional view for describing the erase verify operation according to the third embodiment.
Figure 27:
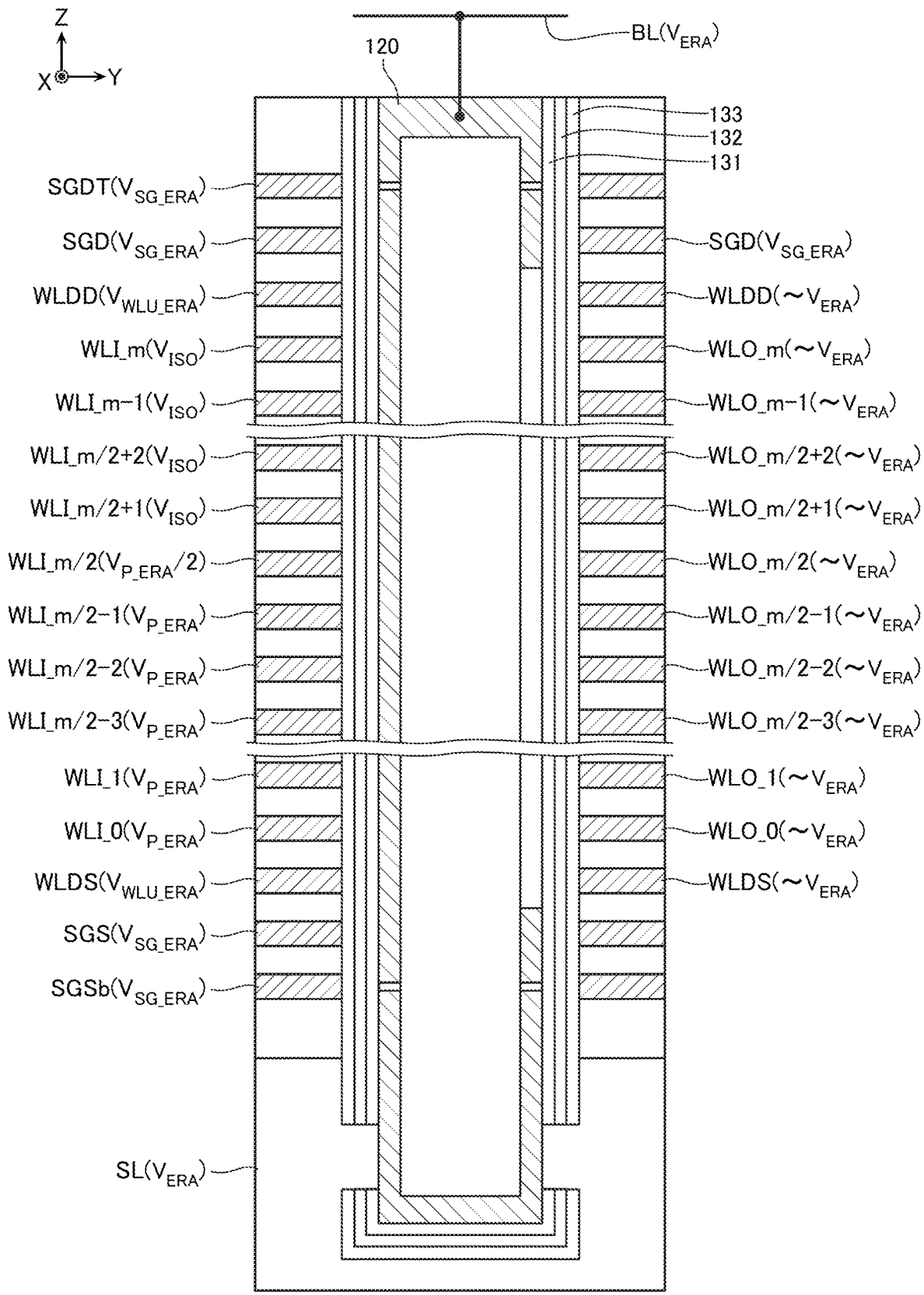
FIG. 27 is a schematic cross-sectional view for describing a single-side erase voltage supply operation according to the third embodiment.
Figure 28:
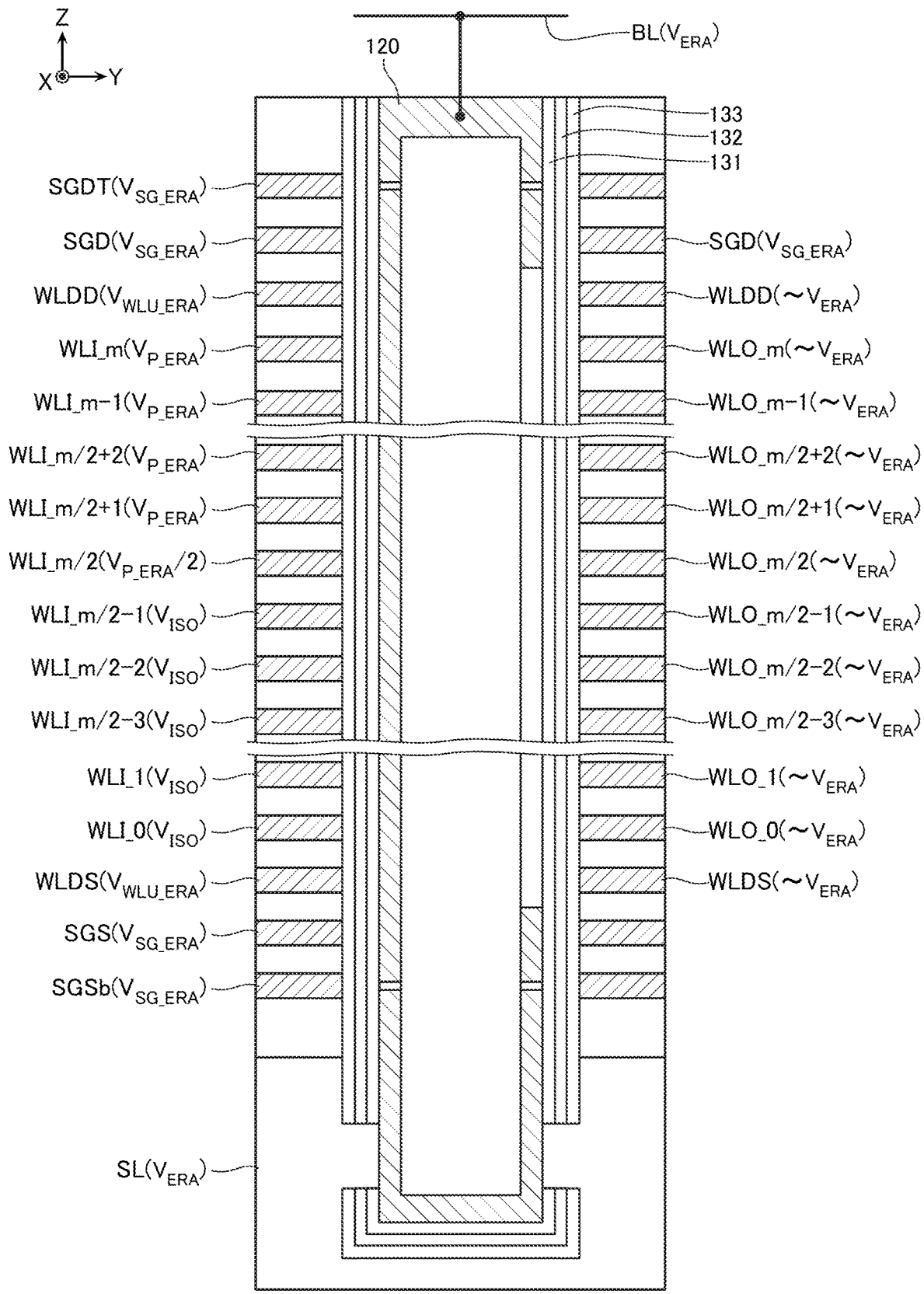
FIG. 28 is a schematic cross-sectional view for describing the single-side erase voltage supply operation according to the third embodiment.

Next, with reference to FIGS. 23 to 28, an erase operation according to the third embodiment will be described. FIGS. 23 and 24 are schematic flowcharts for describing the erase operation according to the third embodiment. FIGS. 25 and 26 are schematic cross-sectional views for describing an erase verify operation according to the third embodiment. FIGS. 27 and 28 are schematic cross-sectional views for describing a single-side erase voltage supply operation according to the third embodiment.

A semiconductor memory device according to the third embodiment is basically configured similarly to the semiconductor memory device according to the first embodiment. However, the erase operation according to the third embodiment is different from the erase operation according to the first embodiment.

That is, in the erase operation according to the first embodiment, as described with reference to FIG. 9 and the like, after it is determined as erase verify PASS at Step S104, the single-side erase voltage supply operation relative to the plurality of memory cells MCI included in the selected memory block BLK$_S$, or the single-side erase voltage supply operation relative to the plurality of memory cells MCO is executed.

On the other hand, in the erase operation according to the third embodiment, after it is determined as erase verify PASS at Step S306, which is described later, of all the memory cells MCI, MCO included in the selected memory block BLK$_S$, at least one of the single-side erase voltage supply operation relative to upper-half memory cells MCI (for example, when m is an even number, the memory cells MCI connected to the word lines WLI_m/2+1 to WLI_m), the single-side erase voltage supply operation relative to lower-half memory cells MCI (for example, when m is the even number, the memory cells MCI connected to the word lines WLI_0 to WLI_m/2−1), the single-side erase voltage supply operation relative to upper-half memory cells MCO (for example, when m is the even number, the memory cells MCO connected to the word lines WLO_m/2+1 to WLO_m), and the single-side erase voltage supply operation relative to lower-half memory cells MCO (for example, when m is the even number, the memory cells MCO connected to the word lines WLO_0 to WLO_m/2−1) is executed.

In the semiconductor memory device according to the third embodiment, the memory cell MCI connected to the word line WLI_m/2 and the memory cell MCO connected to the word line WLO_m/2 are used as the dummy cells and are not used for storing the data. Consequently, in the following example, the single-side erase voltage supply operation and the erase verify operation to these memory cells MCI, MCO are not executed.

Step S301 (FIG. 23) is executed similarly to Step S101 described with reference to FIG. 9 and the like.

Step S302 is basically executed similarly to Step S102 described with reference to FIG. 9 and the like. However, at Step S102, the erase verify operation is executed with respect to all the memory cells MCI included in the selected memory block BLK$_S$. On the other hand, at Step S302, of all the memory cells MCI included in the selected memory block BLK$_S$, the erase verify operation is executed to the upper-half memory cells MCI.

For example, in the odd number verify operation at Step S102 in FIG. 9, as described with reference to FIG. 12, among the plurality of word lines WLI_0 to WLI_m, the erase verify voltage V$_{VFYEr}$ is applied to the odd-numbered word lines WLI counted from the lower side, and the read pass voltage V$_{READ}$ is applied to the even-numbered word lines WLI counted from the lower side. On the other hand, in the odd number verify operation at Step S302, as illustrated in FIG. 25, among the plurality of word lines WLI_m/2+1 to WLI_m, the erase verify voltage V$_{VFYEr}$ is applied to the odd-numbered word lines WLI counted from the lower side, and the read pass voltage V$_{READ}$ is applied to the even-numbered word lines WLI counted from the lower side. In the odd number verify operation, the read pass voltage V$_{READ}$ is applied to the plurality of word lines WLI_0 to WLI_m/2.

For example, in the even number verify operation at Step S102 in FIG. 9, as described with reference to FIG. 13, among the plurality of word lines WLI_0 to WLI_m, the erase verify voltage V$_{VFYEr}$ is applied to the even-numbered word lines WLI counted from the lower side, and the read pass voltage V$_{READ}$ is applied to the odd-numbered word lines WLI counted from the lower side. On the other hand, in the even number verify operation at Step S302, as illustrated in FIG. 26, among the plurality of word lines WLI_m/2+1 to WLI_m, the erase verify voltage V$_{VFYEr}$ is applied to the even-numbered word lines WLI counted from the lower side, and the read pass voltage V$_{READ}$ is applied to the odd-numbered word lines WLI counted from the lower side. In the even number verify operation, the read pass voltage V$_{READ}$ is applied to the plurality of word lines WLI_0 to WLI_m/2.

Step S303 is basically executed similarly to Step S102 described with reference to FIG. 9 and the like. However, at Step S102, the erase verify operation is executed to all the memory cells MCI included in the selected memory block BLK$_S$. On the other hand, at Step S303, of all the memory cells MCI included in the selected memory block BLK$_S$, the erase verify operation is executed to the lower-half memory cells MCI.

Step S304 is basically executed similarly to Step S103 described with reference to FIG. 9 and the like. However, at Step S103, the erase verify operation is executed to all the memory cells MCO included in the selected memory block BLK$_S$. On the other hand, at Step S304, of all the memory cells MCO included in the selected memory block BLK$_S$, the erase verify operation is executed to the upper-half memory cells MCO.

Step S305 is basically executed similarly to Step S103 described with reference to FIG. 9 and the like. However, at Step S103, the erase verify operation is executed to all the memory cells MCO included in the selected memory block BLK$_S$. On the other hand, at Step S305, of all the memory cells MCO included in the selected memory block BLK$_S$, the erase verify operation is executed to the lower-half memory cells MCO.

At Step S306 (FIG. 23), results of the erase verify operation from Step S302 to Step S305 are determined. For example, in each of Step S302 to Step S305, when the ratio of the memory cells MCI detected as the OFF state is the certain number or more, it is determined as erase verify FAIL, and the process proceeds to Step S301. On the other hand, for example, in at least one of Step S302 to Step S305, when the ratio of the memory cells MCI detected as the OFF state is less than the certain number, it is determined as erase verify PASS, and the process proceeds to Step S307 (FIG. 24).

At Step S307, among the erase verify operations at Step S302 and Step S309, the result executed immediately before Step S307 is determined. For example, when the ratio of the memory cells MCI detected as the OFF state at Step S302 or Step S309 is the certain number or more, it is determined as erase verify FAIL, and the process proceeds to Step S308. On the other hand, when the ratio of the memory cells MCI detected as the OFF state at Step S302 or Step S309 is less than the certain number, it is determined as erase verify PASS, and the process proceeds to Step S310.

Step S308 is basically executed similarly to Step S106 described with reference to FIG. 9 and the like. However, at Step S106, the single-side erase voltage supply operation is executed to all the memory cells MCI included in the selected memory block BLK$_S$. On the other hand, at Step S308, of all the memory cells MCI included in the selected memory block BLK$_S$, the single-side erase voltage supply operation is executed to the upper-half memory cells MCI.

For example, in the single-side erase voltage supply operation at Step S106 in FIG. 9, as described with reference to FIG. 15, the voltage V$_{ISO}$ is applied to all of the plurality of word lines WLI_0 to WLI_m. On the other hand, in the single-side erase voltage supply operation at Step S308 in FIG. 24, as illustrated in FIG. 27, the voltage V$_{ISO}$ is applied to the plurality of word lines WLI_m/2+1 to WLI_m, a voltage V$_{P\_ERA}$ is applied to the plurality of word lines WLI_0 to WLI_m/2−1, and a voltage having a magnitude of half of the voltage $V_{P\_ERA}$ is applied to the word line WLI_m/2 between these. The voltage $V_{P\_ERA}$ is larger than the voltage $V_{ISO}$ and smaller than the erase voltage $V_{ERA}$. The difference between the erase voltage $V_{ERA}$ and the voltage $V_{P\_ERA}$ is larger than the threshold voltages for operating the memory cells MCI, MCO as PMOS transistors. Consequently, for example, as illustrated in FIG. 27, the hole channels are formed in the channel regions of the lower-half memory cells MCI. However, the threshold voltages of the lower-half memory cells MCI do not decrease.

At Step S309, similarly to Step S302, the erase verify operation relative to the upper-half memory cells MCI.

At Step S310, among the erase verify operations at Step S303 and Step S312, the result of the erase verify operation executed immediately before Step S310 is determined. For example, when the ratio of the memory cells MCI detected as the OFF state at Step S303 or Step S312 is the certain number or more, it is determined as erase verify FAIL, and the process proceeds to Step S311. On the other hand, for example, when the ratio of the memory cells MCI detected as the OFF state at Step S303 or Step S312 is less than the certain number, it is determined as erase verify PASS, and the process proceeds to Step S313.

Step S311 is basically executed similarly to Step S106 described with reference to FIG. 9 and the like. However, at Step S106, the single-side erase voltage supply operation is executed to all the memory cells MCI included in the selected memory block $BLK_S$. On the other hand, at Step S311, of all the memory cells MCI included in the selected memory block $BLK_S$, the single-side erase voltage supply operation is executed to the lower-half memory cells MCI.

For example, in the single-side erase voltage supply operation at Step S106 in FIG. 9, as described with reference to FIG. 15, the voltage $V_{ISO}$ is applied to all of the plurality of word lines WLI_0 to WLI_m. On the other hand, in the single-side erase voltage supply operation at Step S311 in FIG. 24, as illustrated in FIG. 28, the voltage $V_{ISO}$ is applied to the plurality of word lines WLI_O to WLI_m/2−1, the voltage $V_{P\_ERA}$ is applied to the plurality of word lines WLI_m/2+1 to WLI_m, and the voltage having a magnitude of half of the voltage $V_{P\_ERA}$ is applied to the word line WLI_m/2 between these.

At Step S312, similarly to Step S303, the erase verify operation relative to the lower-half memory cells MCI is executed.

At Step S313, among the erase verify operations at Step S304 and Step S315, the result of the erase verify operation executed immediately before Step S313 is determined. For example, when the ratio of the memory cells MCO detected as the OFF state at Step S304 or Step S315 is the certain number or more, it is determined as erase verify FAIL, and the process proceeds to Step S314. On the other hand, for example, when the ratio of the memory cells MCO detected as the OFF state at Step S304 or Step S315 is less than the certain number, it is determined as erase verify PASS, and the process proceeds to Step S316.

Step S314 is basically executed similarly to Step S109 described with reference to FIG. 9 and the like. However, at Step S109, the single-side erase voltage supply operation is executed to all the memory cells MCO included in the selected memory block $BLK_S$. On the other hand, at Step S314, of all the memory cells MCO included in the selected memory block $BLK_S$, the single-side erase voltage supply operation is executed to the upper-half memory cells MCO.

At Step S315, similarly to Step S304, the erase verify operation is executed relative to the upper-half memory cells MCO.

At Step S316, among the erase verify operations at Step S305 and Step S318, the result of the erase verify operation executed immediately before Step S316 is determined. For example, when the ratio of the memory cells MCO detected as the OFF state at Step S305 or Step S318 is the certain number or more, it is determined as erase verify FAIL, and the process proceeds to Step S317. On the other hand, for example, when the ratio of the memory cells MCO detected as the OFF state at Step S305 or Step S318 is less than the certain number, it is determined as erase verify PASS, and the erase operation is terminated.

Step S317 is basically executed similarly to Step S109 described with reference to FIG. 9 and the like. However, at Step S109, the single-side erase voltage supply operation is executed to all the memory cells MCO included in the selected memory block $BLK_S$. On the other hand, at Step S317, of all the memory cells MCO included in the selected memory block $BLK_S$, the single-side erase voltage supply operation is executed to the lower-half memory cells MCO.

At Step S318, similarly to Step S305, the erase verify operation relative to the lower-half memory cells MCO is executed.

Other Embodiments

The semiconductor memory devices according to the first embodiment to the third embodiment have been described above. However, the configurations indicated in the first embodiment to the third embodiment are merely examples, and the specific configuration and the like of the semiconductor memory device is adjustable as necessary. The operations indicated in the first embodiment to the third embodiment are also merely examples, the magnitude of the voltage, the timing to apply the voltage, and the like are adjustable as necessary.

For example, the semiconductor memory device may be configured to be able to execute two or more erase operations among the erase operations according to the first embodiment to the third embodiment.

For example, in the single-side erase voltage supply operation according to the third embodiment, similarly to the single-side erase voltage supply operation according to the first embodiment, the fixed voltage is applied to one of the word lines WLI and the word lines WLO. However, in the single-side erase voltage supply operation according to the third embodiment, similarly to the single-side erase voltage supply operation according to the second embodiment, one of the word lines WLI and the word lines WLO may be set to the floating state.

For example, in the erase operation according to the third embodiment, the plurality of memory cells MCI, MCO included in the selected memory block $BLK_s$ are divided into groups of the upper-half memory cells MCI, the lower-half memory cells MCI, the upper-half memory cells MCO, and the lower-half memory cells MCO. The single-side erase voltage supply operation and the erase verify operation are independently executed to these four groups. Here, in the erase operation according to the third embodiment, the plurality of memory cells MCI, MCO included in the selected memory block $BLK_S$ may be divided into three groups or may be divided into five or more groups. When it is determined as erase verify PASS regarding a part of the plurality of groups, and it is not determined as erase verify PASS regarding two or more groups, the single-side erase voltage supply operation may be collectively executed relative to these two or more groups.

In the examples described above, in the erase voltage supply operation, the erase voltage $V_{ERA}$ is applied to both of the bit line BL and the source line SL. However, in the erase operation, the erase voltage $V_{ERA}$ may be applied only to one of the bit line BL and the source line SL.

In the examples described above, the example where the upper end and the lower end of the semiconductor layer 120 are connected to the n-type semiconductor layer. However, at least one of the upper end and the lower end of the semiconductor layer 120 may be connected to a p-type semiconductor layer of boron (B) or the like. In this case, in the erase voltage supply operation, instead of supplying the holes to the semiconductor layer 120 by generating the GIDL, the holes may be supplied to the semiconductor layer 120 from at least one of the source line SL and the bit line BL via the p-type semiconductor layer.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a plurality of first conductive layers arranged in a first direction;
    a plurality of second conductive layers disposed to be spaced from the plurality of first conductive layers in a second direction intersecting with the first direction, the plurality of second conductive layers being arranged in the first direction;
    a first semiconductor layer disposed between the plurality of first conductive layers and the plurality of second conductive layers, the first semiconductor layer extending in the first direction and being opposed to the plurality of first conductive layers and the plurality of second conductive layers;
    a charge storage layer including a first part and a second part, the first part being disposed between the plurality of first conductive layers and the first semiconductor layer, the second part being disposed between the plurality of second conductive layers and the first semiconductor layer;
    a first wiring electrically connected to the first semiconductor layer;
    a plurality of voltage supply lines applying a voltage to at least one of the plurality of first conductive lavers or the plurality of second conductive layers;
    a plurality of first current paths disposed between the plurality of first conductive layers and the plurality of voltage supply lines, the plurality of first current paths each including a first transistor; and
    a plurality of second current paths disposed between the plurality of second conductive layers and the plurality of voltage supply lines, the plurality of second current paths each including a second transistor, wherein
        the semiconductor memory device is configured to be able to execute an erase operation including a first erase loop and a second erase loop,
        in the first erase loop, the semiconductor memory device applies a first voltage to at least a part of the plurality of first conductive layers, applies the first voltage to at least a part of the plurality of second conductive layers, and applies an erase voltage larger than the first voltage to the first wiring, and
        in the second erase loop, the semiconductor memory device applies the first voltage to at least a part of the plurality of first conductive layers, applies a second voltage larger than the first voltage to at least a part of the plurality of second conductive layers, and applies the erase voltage to the first wiring.

2. The semiconductor memory device according to claim 1, wherein in the erase operation, the second erase loop is executed after the first erase loop.

3. The semiconductor memory device according to claim 1, wherein in the erase operation, the first erase loop and the second erase loop are each executed for multiple times.

4. The semiconductor memory device according to claim 1, wherein
    the semiconductor memory device is configured to be able to execute a third erase loop in addition to the first erase loop and the second erase loop, and
    when one of the plurality of first conductive layers is assumed to be a third conductive layer, and
    when another one of the plurality of first conductive layers is assumed to be a fourth conductive layer,
        in the second erase loop, the semiconductor memory device applies the first voltage to the third conductive layer and applies a third voltage larger than the first voltage to the fourth conductive layer, and
        in the third erase loop, the semiconductor memory device applies the third voltage to the third conductive layer and applies the first voltage to the fourth conductive layer.

5. The semiconductor memory device according to claim 4, wherein in the erase operation, the third erase loop is executed after the first erase loop.

6. The semiconductor memory device according to claim 4, wherein in the erase operation, the third erase loop is executed for multiple times.

7. The semiconductor memory device according to claim 1, wherein
    the semiconductor memory device is configured to be able to execute the erase operation including a first erase verify operation and a second erase verify operation,
    in the first erase verify operation, the semiconductor memory device applies an erase verify voltage to at least a part of the plurality of first conductive layers, applies a fourth voltage smaller than the erase verify voltage to at least a part of the plurality of second conductive layers, and applies a fifth voltage smaller than the erase verify voltage to the first wiring, and
    in the second erase verily operation, the semiconductor memory device applies the erase verify voltage to at least a part of the plurality of second conductive layers, applies the fourth voltage to at least a part of the plurality of first conductive layers, and applies the fifth voltage to the first wiring.

8. The semiconductor memory device according to claim 7, wherein in the erase operation, the first erase verify operation and the second erase verify operation are executed between the second erase loop and the first erase loop.

9. The semiconductor memory device according to claim 7, wherein in the erase operation, the first erase verify operation is executed after the second erase loop.

10. The semiconductor memory device according to claim 7, wherein
in the erase operation,
the first erase verify operation is executed for multiple times, and
the second erase verify operation is executed for multiple times.

11. A semiconductor memory device comprising:
a plurality of first conductive layers arranged in a first direction;
a plurality of second conductive layers disposed to be spaced from the plurality of first conductive layers in a second direction intersecting with the first direction, the plurality of second conductive layers being arranged in the first direction;
a first semiconductor layer disposed between the plurality of first conductive layers and the plurality of second conductive layers, the first semiconductor layer extending in the first direction and being opposed to the plurality of first conductive layers and the plurality of second conductive layers;
a charge storage layer including a first part disposed between the plurality of first conductive layers and the first semiconductor layer and a second pail disposed between the plurality of second conductive layers and the first semiconductor layer;
a first wiring electrically connected to the first semiconductor layer;
a plurality of voltage supply lines applying a voltage to at least one of the plurality of first conductive layers or the plurality of second conductive layers;
a plurality of first current paths disposed between the plurality of first conductive layers and the plurality of voltage supply lines, the plurality of first current paths each including a first transistor; and
a plurality of second current paths disposed between the plurality of second conductive layers and the plurality of voltage supply lines, the plurality of second current paths each including a second transistor, wherein
the semiconductor memory device is configured to be able to execute an erase operation that includes a first erase loop and a second erase loop,
in the first erase loop, the semiconductor memory device applies a first voltage to at least a part of the plurality of first conductive layers, applies the first voltage to at least a part of the plurality of second conductive layers, and applies an erase voltage larger than the first voltage to the first wiring, and
in the second erase loop, the semiconductor memory device applies the first voltage to at least a part of the plurality of first conductive layers, applies a first signal voltage for setting the second transistor to an OFF state to a gate electrode of at least one of the second transistors in the second current paths corresponding to at least a part of the plurality of second conductive layers, and applies the erase voltage to the first wiring.

12. The semiconductor memory device according to claim 11, wherein in the erase operation, the second erase loop is executed after the first erase loop.

13. The semiconductor memory device according to claim 11, wherein in the erase operation, the first erase loop and the second erase loop are each executed for multiple times.

14. The semiconductor memory device according to claim 11 wherein
the semiconductor memory device is configured to be able to execute a third erase loop in addition to the first erase loop and the second erase loop, and
when one of the plurality of first conductive layers is assumed to be a third conductive layer, and
when another one of the plurality of first conductive layers is assumed to be a fourth conductive layer,
in the second erase loop, the semiconductor memory device applies the first voltage to the third conductive layer and applies a third voltage larger than the first voltage to the fourth conductive layer, and
in the third erase loop, the semiconductor memory device applies the third voltage to the third conductive layer and applies the first voltage to the fourth conductive layer.

15. The semiconductor memory device according to claim 14, wherein in the erase operation, the third erase loop is executed after the first erase loop.

16. The semiconductor memory device according to claim 14, wherein in the erase operation, the third erase loop is executed for multiple times.

17. The semiconductor memory device according to claim 11 wherein
the semiconductor memory device is configured to be able to execute the erase operation that includes a first erase verify operation and a second erase verify operation,
in the first erase verify operation, the semiconductor memory device applies an erase verify voltage to at least a part of the plurality of first conductive layers, applies a fourth voltage smaller than the erase verify voltage to at least a part of the plurality of second conductive layers, and applies a filth voltage smaller than the erase verify voltage to the first wiring, and
in the second erase verify operation, the semiconductor memory device applies the erase verify voltage to at least a part of the plurality of second conductive layers, applies the fourth voltage to at least a part of the plurality of first conductive layers, and applies the fifth voltage to the first wiring.

18. The semiconductor memory device according to claim 17, wherein in the erase operation, the first erase verify operation and the second erase verify operation are executed between the second erase loop and the first erase loop.

19. The semiconductor memory device according to claim 17, wherein in the erase operation, the first erase verify operation is executed after the second erase loop.

20. The semiconductor memory device according to claim 17, wherein in the erase operation,
the first erase verify operation is executed for multiple times, and
the second erase verify operation is executed for multiple times.

* * * * *